United States Patent
McElvain

(10) Patent No.: US 8,286,118 B2
(45) Date of Patent: *Oct. 9, 2012

(54) INTEGRATED CIRCUIT DEVICES AND METHODS AND APPARATUSES FOR DESIGNING INTEGRATED CIRCUIT DEVICES

(75) Inventor: Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/101,043

(22) Filed: May 4, 2011

(65) Prior Publication Data

US 2011/0214100 A1    Sep. 1, 2011

Related U.S. Application Data

(62) Division of application No. 10/626,031, filed on Jul. 23, 2003, now Pat. No. 7,943,436.

(60) Provisional application No. 60/399,760, filed on Jul. 29, 2002.

(51) Int. Cl.
  *G06F 17/50* (2006.01)
(52) U.S. Cl. ......................... 716/130; 716/126; 716/129
(58) Field of Classification Search .................. 716/119, 716/120, 122, 126, 127, 129, 130, 132, 133
  See application file for complete search history.

(56) References Cited

U.S. PATENT DOCUMENTS

| | | |
|---|---|---|
| 4,353,040 A | 10/1982 | Krumm et al. |
| 5,075,753 A | 12/1991 | Kozono |
| 5,288,949 A | 2/1994 | Crafts |
| 5,334,800 A | 8/1994 | Kenney |
| 5,682,124 A | 10/1997 | Suski |
| 5,723,908 A | 3/1998 | Fuchida |
| 5,892,250 A | 4/1999 | Yoshida |
| 5,999,440 A | 12/1999 | Crafts |
| 6,180,998 B1 | 1/2001 | Crafts |
| 6,218,631 B1 | 4/2001 | Hetzel et al. |
| 6,278,148 B1 | 8/2001 | Watanabe et al. |
| 6,335,642 B1 * | 1/2002 | Hiroshima et al. ........... 327/102 |

(Continued)

FOREIGN PATENT DOCUMENTS

EP    1497864 B1    6/2008

(Continued)

OTHER PUBLICATIONS

Banerjee et al., "Analysis and Optimization of Thermal Issues in High-Performance VLSI," ACM, 2001, pp. 230-237.

(Continued)

*Primary Examiner* — Vuthe Siek
(74) *Attorney, Agent, or Firm* — Blakely, Sokoloff, Taylor & Zafman LLP; Judith A. Szepesi

(57) ABSTRACT

Methods and apparatuses to design an Integrated Circuit (IC) with a shielding of wires. In at least one embodiment of the present invention, a shielding mesh of at least two reference voltages (e.g., power and ground) is used to reduce both the capacitive coupling and the inductive coupling in routed signal wires in IC chips. In some embodiments, a type of shielding mesh (e.g., a shielding mesh with a window surrounded by a power ring, or a window with a parser set of shielding wires) is selected to make more routing area available in locally congested areas. In other embodiments, the shielding mesh is used to create or add bypass capacitance. Other embodiments are also disclosed.

72 Claims, 31 Drawing Sheets

U.S. PATENT DOCUMENTS

| | | | |
|---|---|---|---|
| 6,348,722 | B1 | 2/2002 | Yoshikoshi |
| 6,353,189 | B1 | 3/2002 | Shimada et al. |
| 6,388,200 | B2 | 5/2002 | Schaper |
| 6,396,150 | B2 | 5/2002 | Kohno |
| 6,483,374 | B1 | 11/2002 | Mizuno et al. |
| 6,510,545 | B1 | 1/2003 | Yee et al. |
| 6,530,066 | B1 | 3/2003 | Ito et al. |
| 6,603,165 | B2 | 8/2003 | Yamauchi et al. |
| 6,622,294 | B2 | 9/2003 | Saxena et al. |
| 6,664,638 | B2 | 12/2003 | Ushiyama et al. |
| 6,734,472 | B2 | 5/2004 | Ho |
| 7,166,352 | B2 | 1/2007 | Watanabe et al. |
| 7,217,887 | B2 | 5/2007 | Ho |
| 7,361,975 | B2 | 4/2008 | Ushiyama et al. |
| 7,436,008 | B2 | 10/2008 | Ho |
| 7,943,436 | B2 * | 5/2011 | McElvain ............ 438/129 |
| 2001/0013422 | A1 | 8/2001 | Schaper |
| 2002/0076941 | A1 | 6/2002 | Ushiyama et al. |
| 2002/0101759 | A1 | 8/2002 | Jasinski et al. |
| 2003/0155642 | A1 | 8/2003 | Davis et al. |
| 2003/0201472 | A1 * | 10/2003 | Ho ......................... 257/207 |
| 2004/0178424 | A1 | 9/2004 | Ho |

FOREIGN PATENT DOCUMENTS

| | | |
|---|---|---|
| GB | 2261991 A | 6/1993 |
| JP | 01-152642 | 6/1989 |
| JP | 2-51252 | 2/1990 |
| JP | 3-120743 A | 5/1991 |
| JP | 05-226340 | 9/1993 |
| JP | 6-291256 A | 10/1994 |
| JP | 09-213888 | 8/1997 |
| JP | 11-191611 | 7/1999 |
| JP | 2000-68276 | 5/2000 |
| JP | 2001-127162 | 5/2001 |
| JP | 2001-345385 | 12/2001 |
| JP | 2002-124855 | 4/2002 |
| JP | 2002-190573 | 7/2002 |
| TW | 462214 | 11/2001 |
| TW | I 285953 | 8/2007 |
| WO | WO 03/092070 A2 | 11/2003 |
| WO | WO 03/092070 A3 | 11/2003 |

OTHER PUBLICATIONS

Hebrard et al., "Design Automation of Power Integrated Circuit in Edge Environment," 1992, IEEE, pp. 252-256.

PCT International Preliminary Report on Patentability for PCT International Application No. US02/24267, mailed Apr. 27, 2006, 4 pages.

PCT International Search Report for PCT International Application No. US02/24267, mailed May 10, 2004, 8 pages.

PCT Written Opinion for International Application No. US02/24267, mailed Jun. 23, 2005, 4 pages.

PCT Written Opinion for International Application No. US03/23559, mailed Apr. 30, 2008, 5 pages.

Yu et al., "Fast Placement-Dependent Full Chip Thermal Simulation," 2001, IEEE, pp. 249-252.

Khatri, Sunil P.; Brayton, Robert K.; and Sangiovanni-Vincentelli, Alberto L. "Cross-Talk Noise Immune VLSI Design Using Regular Layout Fabrics," Kluwer Academic Publishers: Boston, 2001 (front cover and pp. i-xix, 1-51, 95-112 and back cover).

Magma Design Automation, Inc., "Deep-Submicron Signal Integrity", white paper, 2002.

Andrey V. Mezhiba, Eby G. Friedman, "Scaling Trands of On-Chip Power Distribution Noise", SLIP'02, Apr. 6-7, 2002, San Diego, California, USA, pp. 47-53.

Sani R. Nassif, Onsi Fakhouri, "Technology Trends in Power-Grid-Induced Noise", SLIP'02, Apr. 6-7, 2002, San Diego, California, USA pp. 55-59.

Seongkyun Shin, Yungseon Eo, William R. Eisenstadt, Jongin Shim, "Analytical Signal Integrity Verification Models for Inductance-Dominant Multi-Coupled VLSI Interconnects", SLIP'02, Apr. 6-7, 2002, San Diego, California, USA, pp. 61-68.

S. Khatri, A. Mehrotra, R. Brayton, A. Sangiovanni-Vincentelli, and R. Otten, "A novel VLSI layout fabric for deep sub-micron applications," in *Proceedings of the Design Automation Conference*, (New Orleans), Jun. 1999.

Sunil P. Khatri, Robert K. Brayton, Alberto Sangiovanni-Vincentelli, "Cross-talk Immune VLSI Design using a Network of PLAs Embedded in a Regular Layout Fabric", IEEE/ACM International Conference on Computer Aided Design, ICCAD-2000, Nov. 5-9, 2000, San Jose, CA, USA.

PCT International Search Report for PCT International Appln No. US03/23559, mailed Sep. 6, 2004, 9 pages.

Korean Patent Application No. 2005-7001712, Notice of Grounds for Rejection, Issuance date Apr. 29, 2010, 8 pages (English Translation).

Korean Patent Application No. 2005-7001712, Notice of Grounds for Rejection, Issuance date Nov. 30, 2010, 6 pages (English Translation).

Korean Patent Application No. 2010-7019274, Notice of Grounds for Rejection, Issuance date Dec. 27, 2010, 9 pages (English Translation).

Korean Patent Application No. 2011-7004893, Notice of Grounds for Rejection, Issuance date Jun. 15, 2011, 5 pages (English Translation).

Korean Patent Application No. 2011-7019056, Notice of Grounds for Rejection, Issuance Date Dec. 27, 2011, 6 pages (English Translation).

Japanese Patent Application No. 2004-524962, Notice of the Reason for Refusal, Mailing date Jun. 1, 2010, 2 pages (English Translation).

Japanese Patent Application No. 2004-524962, Notice of the Reason for Refusal, Mailing date Jan. 18, 2011, 3 pages (English Translation).

Japanese Patent Application No. 2004-524962, Final Decision of Rejection, Mailing date Aug. 30, 2011, 2 pages (English Translation).

Japanese Patent Application No. 2004-524962, Formal Inquiry, Mailing Date Jun. 5, 2012, 9 pages (English Translation).

\* cited by examiner

INTEGRATED CIRCUIT DEVICES AND METHODS AND APPARATUSES FOR DESIGNING INTEGRATED CIRCUIT DEVICES

This application is a divisional of U.S. application Ser. No. 10/626,031 filed on Jul. 23, 2003, now U.S. Pat. No. 7,943,436 which is related to and claims the benefit of the filing date of U.S. provisional application Ser. No. 60/399,760, filed Jul. 29, 2002, and entitled "Method and Apparatus for Designing Integrated Circuit Devices with Shielding" by the inventor Kenneth S. McElvain.

FIELD OF THE INVENTION

The invention relates to designing integrated circuits, and more particularly to shielding wires from capacitive and inductive coupling.

BACKGROUND OF THE INVENTION

Integrated Circuits (ICs) are used in numerous applications, such as cellular phones, wristwatch cameras, and hand-held organizers, and others. As the commercial markets and consumer demands for smaller Integrated Circuits grow, IC size requirement trends continue towards a small form factor and lowered power consumption.

For the design of digital circuits on the scale of VLSI (very large scale integration) technology and beyond, designers often employ computer aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

As the IC size shrinks, semiconductor manufacturers are forced to design circuits at a much smaller level than in the past. Previously, as the industry moved from Very Large Scale Integration (VLSI) to Ultra Large Scale Integration (ULSI), the relative capacitive and inductive coupling of the circuit itself was not realized to be as critical of an issue.

However, when the semiconductor industry designs and implements circuitry based on the sub-micron level technology and beyond, where spacing between circuitry lines is less than 10-6 microns, the capacitive and inductive coupling of the signal lines within the circuitry itself is realized to be a critical problem for designers. As circuit size becomes smaller and the lengths of signal lines become longer relative to the width of the lines, the problem of coupling and/or cross talk between signal lines and ground or power lines becomes more evident. Furthermore, as the signal line Co ground (and/or other signal lines) coupling becomes stronger, the signal to noise ratio for a given signal decreases proportionally. This particular issue of capacitive and inductive coupling in signals is becoming increasingly difficult as the industry advances and moves towards reduction in circuit device size (for example, from 0.25 micron technology to 0.18 micron, 0.15 micron, 0.13 micron and beyond).

One approach to increase the signal to noise ratio (e.g., with respect to the noise caused by capacitive and inductive coupling from adjacent signal lines) is to strengthen the signal drive level. By increasing the signal strength, the signal to noise ratio for the signal is improved. Unfortunately, to increase the signal strength, the device must also be supplied with higher power, which is inconsistent with the requirement of reducing power consumption in ICs for heat issues, portability issues and environmental issues. In addition to the higher power consumption, increasing the signal strength does not eliminate signal coupling. The signal of increased strength may cause increased noise in the adjacent signal lines through capacitive and inductive coupling.

Another approach is to reduce the effective (R-L-C) impedance of the signal lines by increasing the spacing between signal lines, which is usually combined with the approach of strengthen the signal drive level, to reduce coupling and to improve signal to noise ratio. In general, when the spacing between the signal lines is increased by three-fold, the coupling effect is reduced by fifty percent. However, increasing the spacing is inconsistent with the requirement for circuit compactness.

Another approach is to insert buffers/repeaters to keep the wires short, reducing resistance and coupling capacitance. This approach works for a moderate number of signals, where an excessive number of buffers/repeaters are not required.

Another approach is to shield the signal lines by using either a supply voltage (e.g., VDD) or ground. The shielding line (ground) is wide enough to have low impedance so that the shielding line itself does not transfer the noise to other signal lines. FIG. 2 shows a top view of shielding lines and signal lines. A signal line (e.g., line 201 or 205) is routed along with a shielding line (e.g., line 203 or 207), which is connected to a supplied voltage or ground to shield the noise from a neighbor signal line. For sub-micron technologies, the lengths of these signal lines and shielding lines can be relatively long with respect to their width. When the path is long, the shielding wires become resistive; and, coupling can take place across the shielding wires to the next neighbor, which tends to reduce the signal to noise ratio or increase cross talk within the circuit on a given substrate.

The above approaches have a lower area and performance cost, but require expensive analyses, which are often questionable, to show that the signal integrity of the wires in the IC is preserved.

SUMMARY OF THE DESCRIPTION

Methods and apparatuses to design an Integrated Circuit (IC) with a shielding of wires of at least two different voltages are described here.

In one aspect of the invention, an exemplary method for designing an integrated circuit (IC) includes determining a desired amount of decoupling capacitance in a representation of a design of the IC, routing signal lines in at least one layer of a shielding mesh of the representation (the routing taking into account the desired amount of decoupling capacitance to provide a preserved space in the shielding mesh for decoupling lines), and routing capacitive decoupling lines in the shielding mesh, thereby using the preserved space.

In another aspect of the invention, an exemplary IC includes at least one layer in the IC which includes a shielding mesh that has a first plurality of lines designed to provide a first reference voltage (e.g. VSS) and a second plurality of lines designed to provide a second reference voltage (e.g. VDD) and a plurality of signal lines routed through the shielding mesh, wherein each of the signal lines is disposed adjacent to at least one of the first plurality or the second plurality of lines and wherein at least one of the first plurality of lines and at least one of the second plurality of lines are adjacent to each other, without a signal line intervening, to provide a capacitive coupling between them.

In another aspect of the invention, an exemplary method for designing an IC includes creating a representation of at least one layer of said IC, the at least one layer having a repeating pattern of at least two adjacent first plurality of lines (designed to provide a first reference voltage, such as, e.g., VSS) and at least two adjacent second plurality of lines (designed to provide a second reference voltage, such as, e.g., VDD) and includes creating a representation of at least one signal line disposed adjacent to at least one of the first or the second plurality of lines. This method may further include creating a representation of at least one additional line designed to carry said first reference voltage and routed between an adjacent pair of lines of the second plurality of lines, wherein this additional line creates a decoupling capacitor between itself and the adjacent pair of lines.

In another aspect of the present invention, a method to design an Integrated Circuit (IC) device includes: determining a shielding mesh in a substrate, which includes a first plurality of connected wires for a first reference voltage and a second plurality of connected wires for a second reference voltage; and routing a first portion of a first plurality of signal wires in the substrate to shield the first portion of each of the first plurality of the signal wires between one of the first plurality of connected wires and one of the second plurality of connected wires from adjacent signal wires. A second portion of the first plurality of signal wires are adjacent to each other in a region defined by the first and second pluralities of connected wires. This region may be a window. In one example, the wires of the shielding mesh are interconnected such that an average length of segments of the first and second pluralities of connected wires between nodes each of which joins more than two wires in the shielding mesh is substantially less than an average length of the first plurality of signal wires. In one example, the first plurality of connected wires and the second plurality of connected wires are in two layers in the substrate; a first plurality of vias connect the first plurality of wires; a second plurality of vias connect the second plurality of wires; and the first and second pluralities of vias divide the first and second pluralities of connected wires into segments that are substantially shorter than an average length of the first plurality of signal wires. In one example, the first reference voltage is power; the second reference voltage is ground; and the shielding mesh is used both to distribute power and to shield signal lines from capacitive and inductive coupling.

In one embodiment of the present invention, the shielding mesh contains a window defined by a subset of the first and second pluralities of connected wires in a top view of the IC; a third plurality of signal wires are routed within the window without shielding. Each of the third plurality of signal wires are adjacent to at least one of the third plurality of signal wires without shielding in between. In one example, each of the subset of wires is substantially wider than the third plurality of signal wires no that the subset of wires form a power ring that reduces the impedance in the shielding mesh caused by the window in shielding mesh. The window may be created as a result of a congestion analysis which indicates a need for routing resources.

In one embodiment of the present invention, a second plurality of signal wires are routed in the substrate to shield each of the second plurality of signal wires between two of the first plurality of connected wires from adjacent signal wires. The second plurality of signal wires are less subjected to signal integrity problems than the first plurality of signal wires if routed without shielding; and the critical signal lines are routed between shielding wires of different voltages. In one example, the shielding mesh has tracks for routing signal lines between parallel shielding wires of the same voltage; these tracks can be used to widen the shielding wires to increase the current carrying capacity of the shielding wires, if they are not used for signal lines. In one example, at least two of adjacent ones of the first plurality of connected wires are combined into one wider wire; in another example, an area between two of the first plurality of connected wires is filled in to generate one wider wire. Thus, some shielding wires are wider than other shielding wires. For example, one shielding wire is wider than the combined width of one of the first and second pluralities of connected wires and one of the first plurality of signal wires. Alternatively, rather than widening an existing wire, an additional reference voltage line may be added. This additional reference voltage line may be the same or different voltage as the surrounding wires.

In one example, a third plurality of signal wires are routed in a first layer in the substrate between first two wires of the first and second pluralities of connected wires; the first two wires are substantially wider than the third plurality of signal wires; the third plurality of signal wires are substantially parallel to each other; and each of the third plurality of signal wires is adjacent to at least one of the third plurality of signal wires without shielding in between. Thus, the first two wires define a first window in the shielding mesh within which at least some signal lines are not shielded in the first layer. Further, a fourth plurality of signal wires are routed in a second layer in the substrate with second two wires of the second and second pluralities of connected wires; the second two wires are substantially wider than the fourth plurality of signal wires; the fourth plurality of signal wires are substantially parallel to each other; and each of the fourth plurality of signal wires is adjacent to at least one of the fourth plurality of signal wires without shielding in between. Thus, the second two wires define a second window within which at least some signal lines are not shielded in the second layer. In one example, the first and second windows substantially coincide with each other in a top view of the IC. In another example, there is only one window for unshielded signal wires in one of the layers. In one example, an allowable unshielded length of a signal line that can be unshielded by the shielding mesh is determined; and the signal line is routed with a portion of the signal line unshielded by the shielding mesh shorter than the allowable unshielded length.

In one embodiment of the present invention, the first and second pluralities of connected wires of the shielding mesh are routed within a region defined by an IP block, which is described below, in a top view of the IC. Some of the first plurality of signal wires are a part of the IP block; and some of the first plurality of signal wires are not a part of the IP block. In one example, at least one of the first plurality of signal wires that is not a part of the IP block is within a region defined by the IP block in a top view of the IC. In one example, at least one of the first plurality of signal wires that is a part of the IP block is re-routed in the shielding mesh.

The present invention includes apparatuses which perform these methods, including data processing systems which perform these methods and compute readable media which when executed on data processing systems cause the systems to perform these methods. The present invention also includes IC devices designed according to these methods or having the features described herein.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Many of the methods of the present invention may be performed with a digital processing system, such as a conventional, general purpose computer system. Special purpose computers which are designed or programmed to perform only one function may also be used.

Figure 1:
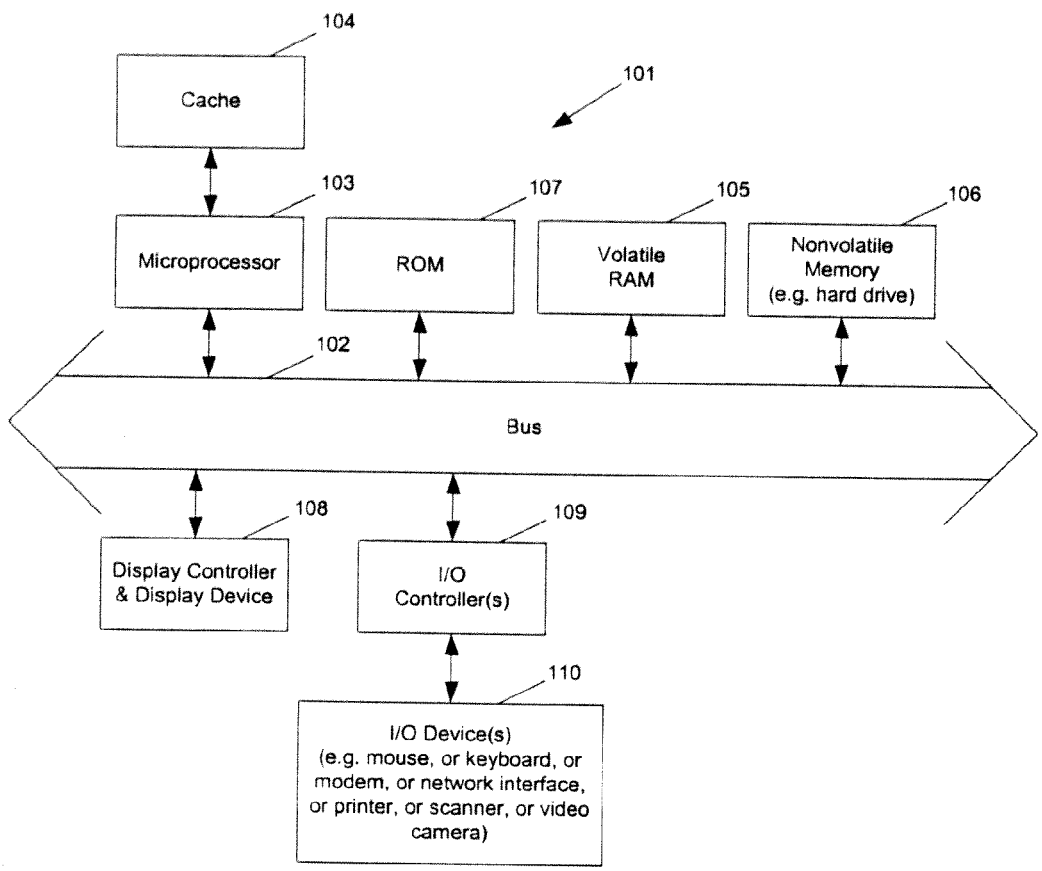
FIG. 1 shows a block diagram example of a data processing system which may be used with the present invention.
Figure 2:
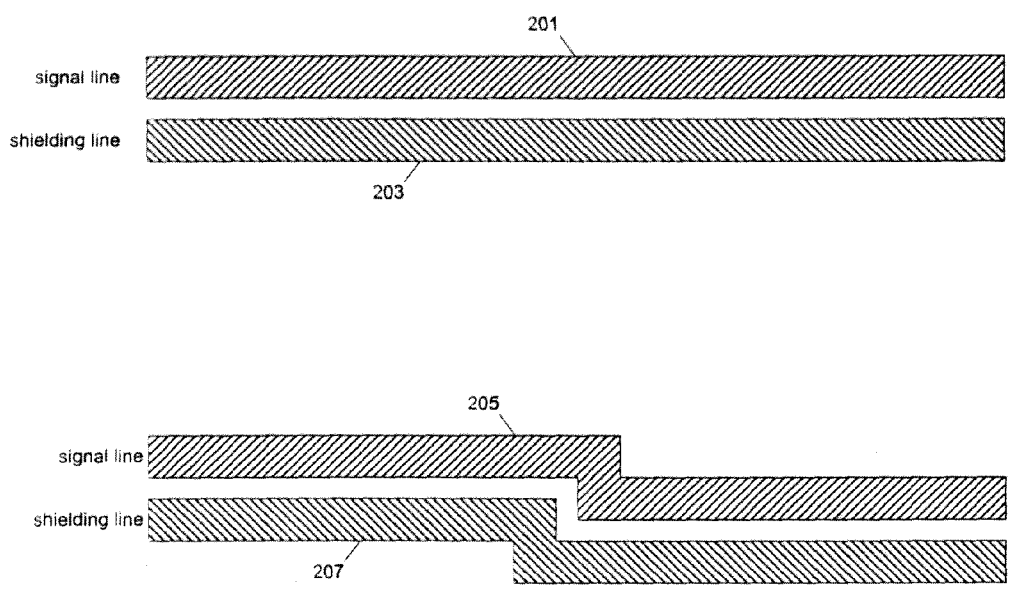
FIG. 2 shows a top view of shielding lines and signal lines.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer or a computer system which runs a Windows or UNIX operating system.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable media can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable media includes any mechanism that provides (i.e., stores and/or transmits) information in a form accessible by a machine (e.g., a computer, network device, personal digital assistant, manufacturing tool, any device with a set of one or more processors, etc.). For example, a machine readable media includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

In at least one embodiment of the present invention, a shielding mesh of at least two reference voltages (e.g., power and ground) is used to reduce both capacitive coupling and inductive coupling in signal wires in IC chips. According to one embodiment of the present invention, a circuit device with a plurality of signal lines disposed within a substrate has a shielding mesh of wires connected to provide power to the circuitry of the substrate circuit and to shield signal lines from each other to reduce the effects of cross talk between nearby signal lines within the circuit device.

It is understood that in this application the width of a wire or line refers to the shorter dimension of the wire parallel to the layer for the wire; and the thickness of a wire refers to the dimension of the wire in a direction that is perpendicular to the layer.

Figure 3:
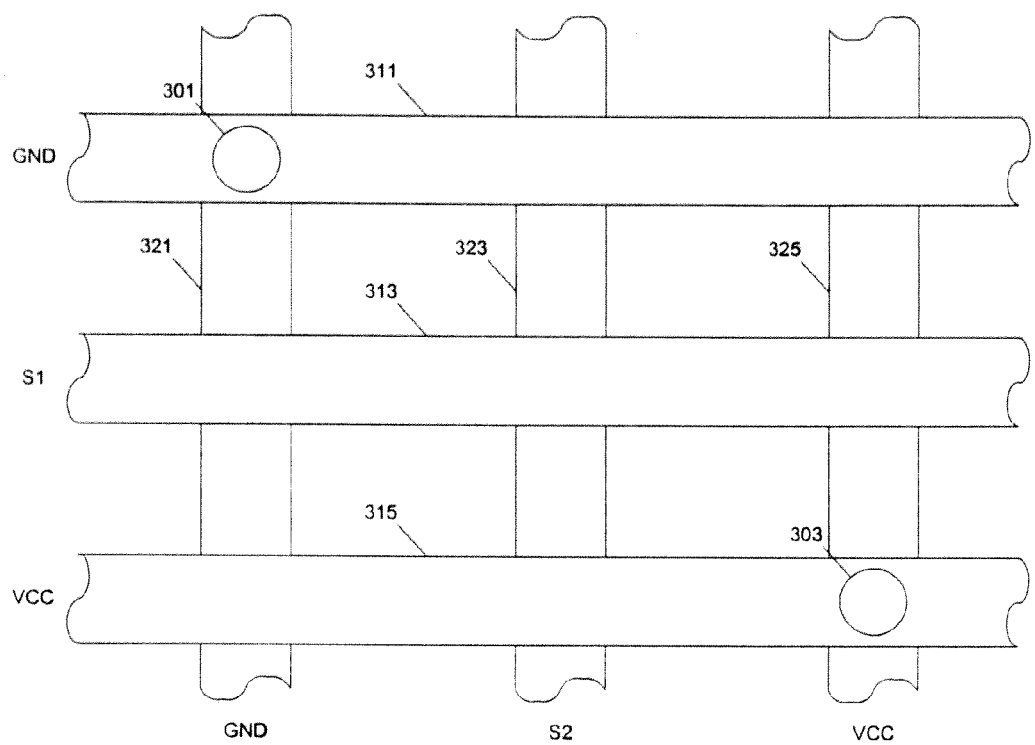
FIG. 3 shows a top view of signal lines shielded by a two-layer shielding mesh according to one embodiment of the present invention.
Figure 4:
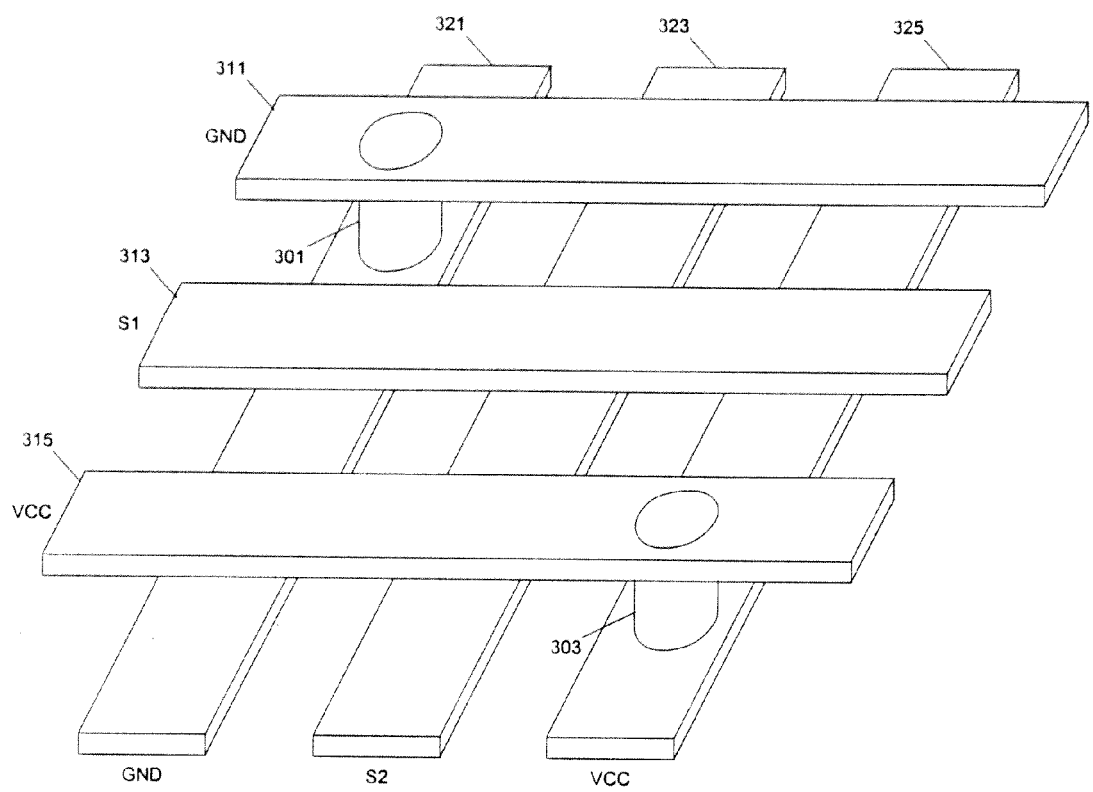
FIG. 4 shows a perspective view of signal lines shielded by a two-layer shielding mesh according to one embodiment of the present invention (the insulating layer between the two-layer shielding mesh is not shown).

FIG. 3 shows a top view of signal lines shielded by a two-layer shielding mesh according to one embodiment of the present invention; and, FIG. 4 shows a perspective view of the signal lines shielded by the two-layer shielding mesh. According to this embodiment, a signal line is shielded on both sides by a shielding mesh connected to reference voltages GND (ground) and VCC (power). Lines 311-315 are on one layer of an IC; and lines 32'-325 are on another layer of the IC. Lines 311 and 321, connected by via 301, provide shielding at voltage GND; and, lines 315 and 325, connected by via 303, provide shielding at voltage VCC. Signal line 313 is shielded at both sides by lines 311 and 315 of different voltages; and signal line 323 is shielded at both sides by lines 321 and 325. The lines in the two layers are running in an angle (e.g., 90 degrees, 45 degrees, or an acute angle or an angle other than 90 degrees) so that one shielding line in one layer can be connected to several shielding lines in another layer through vias. For example, vias 301 and 303 connects lines 321, 311 and lines 315 and 325 to form two interwoven meshes, each of which is a mesh of wires interconnected through vias and energized by one or more reference voltages (e.g., GND or VCC).

In accordance with one embodiment of the present invention the shielding mesh is included on an IC in addition to a power grid used to supply power and ground to the circuitry. According to another embodiment, for example in a 0.25 micron technology, the relative segment distance of the VDD and VSS lines may be reduced to as small as 0.94 micron. Reducing the segment lengths of shielding lines reduces their effective RC component and the coupling effects which are the sources of noises.

Due to close proximity of the shielding lines coupled with the fact that the shielding lines are of relatively short segments (e.g., due to connections at vias 311 and 303), the effective RC impedance, as well as the signal coupling between signal lines, is reduced. In one embodiment of the present invention, the width of the signal lines is the same as the width of the shielding lines; in other embodiments of the present invention, the widths of some of the shielding lines are different from that of the typical signal lines. The density of lines in a shielding mesh depend on the IC and the application and purpose of the mesh relative to the IC. In one case, the reference voltage lines (e.g. VSS and VDD) may be as dense as at least two reference voltage lines in a distance of less than 1 micron; in other words, a distance separating two adjacent reference voltage lines may be less than 1 micron and the density in an area may be higher than 10 lines in a 10 micron by 10 micron area. The density of all lines in the mesh in this case (including signal lines routed between reference voltage lines and any additional reference voltage lines which are added into the mesh for decoupling capacitance purposes) is even higher than 10 lines in a 10 micron by 10 micron area. The widths of these lines also depend on the IC and the application and purpose of the line. The signal lines may have a width as small as the currently available technology allows (e.g. smaller than 0.5 microns or smaller) and the width of the reference voltage lines may be as small.

In one embodiment of the present invention, a single layer shielding mesh has a plurality of shielding wires of different reference voltages for shielding a plurality of signal lines from each other.

Figure 5:
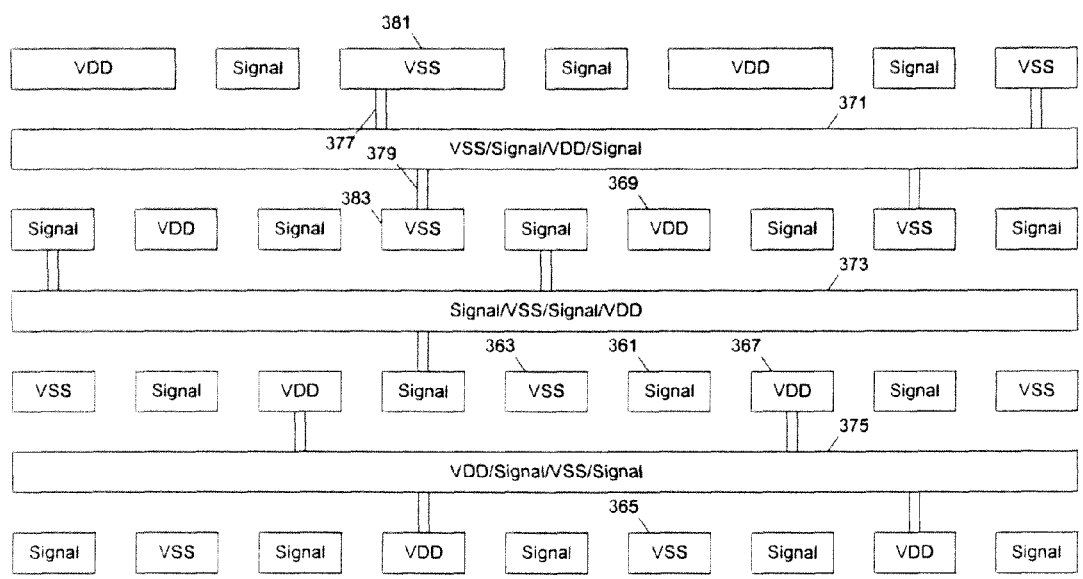
FIG. 5 shows a vertical cross-sectional view of signal lines shielded by a multi-layer shielding mesh according to one embodiment of the present invention.

FIG. 5 shows a vertical cross-sectional view of signal lines shielded by a multi-layer shielding mesh according to one embodiment of the present invention. Layers 371, 373 and 375 separate the layers on which lines 381, 383, 363 and 365 are located respectively. Within each layer, only one signal line is routed between two reference voltage lines. For example, signal line 361 is shielded on the layer by reference voltage lines 363 and 367, which are for reference voltages VSS and VDD respectively. Reference voltage lines may also shield a signal line across the layers. For example, reference voltage lines 369 and 365 may provide inter-layer shielding for signal line 361. The lines on layers 371, 373 and 375 at the cross-sectional cut can be for VSS, Signal and VDD (or, Signal/VDD/Signal, VSS/Signal/VDD and Signal/VSS/Signal) respectively so that a signal line on one layer is shielded by one or more lines of reference voltages in other layers. In one embodiment of the present invention, the signal lines and reference voltage lines in different layers are all aligned to form a grid structure (e.g., between layers 371 and 375) where lines in a first layer are parallel within the layer and extend in one direction (e.g. from left to right) and lines in another layer are parallel within the another layer but are perpendicularly arranged relative to the first layer; in other embodiments of the present invention, the signal lines and reference voltage lines for different layers are not all aligned to a grid structure (e.g., the layers above and below layer 371). The shielding lines are of the same width in one embodiment; the shielding lines can be of different widths in other embodiments, as illustrated by the cross sections of lines 381 and 383. Vias (e.g., vias 377, 379) are used to interconnect the wires on different layers, especially the wires of reference voltages to reduce the segment sizes of the shielding wires. In one embodiment of the present invention, the shielding lines of different voltages (e.g., VSS and VDD) are on alternating locations in the shielding mesh so that each signal line are shielded between two closest adjacent lines which are of different reference voltages and which are parallel to the signal line in a layer or across several layers).

In one embodiment of the present invention, vias of varying sizes are utilized in as close proximity as possible without dependency of grid size. Utilizing the close proximity of the vias, relative segment lengths of each signal shielded in the shielding mesh are reduced.

According to another embodiment of the present invention, the shielding mesh is utilized to provide a path for connecting an integrated circuit device to the main power grid. For example, line 383 taps into line 381 through vias 379 and 377; and, line 381 is in turn connected to the main power grid.

In some embodiments of the present invention, a type of shielding mesh is selected to make more routing area available in locally congested areas, or to increase the ability of the shielding mesh to deliver current with low voltage drop.

FIGS. 6-10 show examples of shielding meshes for shielding signal lines within a layer according to embodiments of the present invention. It is understood that the reference voltage lines (e.g., lines 401, 405, 411, 415) may have the same voltage, or have different voltages.

Figure 6:
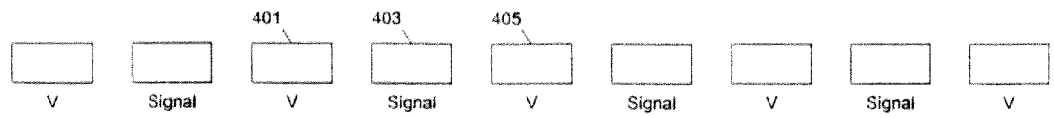
FIGS. 6-10 show examples of shielding meshes for shielding signal lines within a layer according to embodiments of the present invention.

In FIG. 6, each signal line (e.g., line 403) is shielded by two adjacent parallel reference voltage lines (e.g., lines 401 and 405). In one embodiment of the present invention, the two adjacent parallel reference voltage lines for each of the signal lines are of different voltages (e.g., VCC and GND) such that the signal lines are in the sequence of: . . . , VCC, Signal, GND, Signal, VCC, . . . ; in other embodiments of the present invention, the pairs of adjacent parallel reference voltage lines for some signal lines are of the same voltage (e.g., in the sequence of: . . . , VCC, Signal, VCC, GND, Signal, GND, . . . ). The sequence or the pattern of the lines can be selected according to the congestion level in the area, the power distribution requirement, the noise level of the signal lines, and other parameters.

Figure 7:
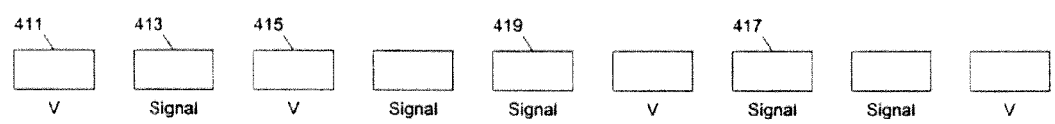

FIG. 7 shows a situation where some of the signal lines are only shielded from one side. Although signal line 413 is shielded from both sides by reference voltage lines 411 and 415, line 419 is shielded only at the right hand side; and line 417 is shielded only at the left hand side. For example, a sequence of VCC, Signal, GND, Signal, Signal, VCC, Signal, Signal, GND can be used for the example of FIG. 7; or a sequence of VCC, Signal, VCC, Signal, Signal, GND, Signal, Signal, GND can be used for the example of FIG. 7. Such a shielding mesh can be used for a relatively congested area, where a large portion of the area is used for routing signal wires. Signal lines that are not subjected to signal integrity problems can be routed next to each other within two shielding lines.

Figure 8:
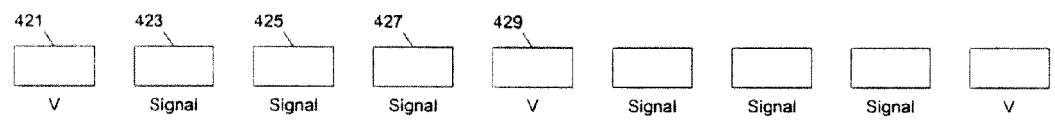

FIG. 8 shows a situation where some of the signals are only shielded from one side and some of the signal lines are not shielded. Although signal lines 423 and 427 are each shielded at the one side by reference voltage lines 421 and 429, signal line 425 is not shielded. Such a shielding mesh can be used for a congested area to provide more areas for routing signal wires. For example, a reference voltage line at the location of 425 is replaced with a signal line that does not cause signal integrity problems when routed between signal lines 423 and 427. This replacement of one reference voltage line, at a location such as location 425, with a signal line may be performed during automated placing and/or routing of components on an IC as part of the computer aided process of designing the IC and it may be performed as a result of detecting congestion in the computer aided routing process. In one scenario, signal line 425 has only a short segment running between signal lines 423 and 427 on that a large portion (in the length direction) of signal lines 423 and 427 are still shielded between adjacent reference voltage lines from both sides. In another scenario, when the timing of signal lines 423-427 are such that coupling between lines 423 and 425 and coupling between lines 425 and 427 do not cause a signal integrity problem, signal line 425 is used as a shielding line to reduce the coupling between lines 423 and 427. An example of such a timing scenario is one where lines 423 and 427 switch states at about the same time in a clock cycle and line 425 switches its state at a different time in the cycle.

Figure 9:
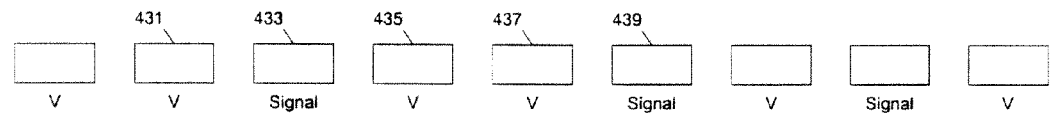

FIG. 9 shows a situation where more than two reference voltage lines are used to separate two signal lines. For example, reference voltage lines 435 and 437 separate signal lines 433 and 439. The extra voltage lines may be used to reduce the impedance of the reference lines, or to change a line sequence or a pattern of the voltage reference lines. Such a shielding mesh can be used in a non-congested region, where more areas can be used for distribution power. In one scenario, segments of some of the reference voltages lines are reconnected to route signal lines, especially short signal lines, which do not have strong coupling with neighbor signal lines.

Figure 10:
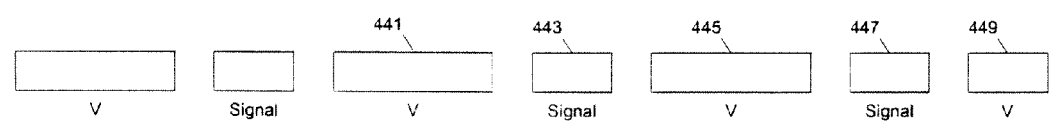

FIG. 10 shows a situation where the reference voltage lines are of different sizes. For example, wider lines 441 and 445 are used to shield line 443, which may be a strong source of noise; and narrower reference voltage line 449 is used to shield line 447. Lines 441 and 445 may be generated by combining one or more adjacent tracks (between the lines) that are not used for routing signal lines.

The shielding meshes as shown in FIGS. 6-10 can be interconnected through vias in different layers to form a multilayer shielding mesh, such as the mesh as shown in FIG. 5.

In one example of the present invention, the shielding mesh within one layer contains at least three parallel shielding wires for completely shielding two or more signal lines, each of which is deposited (e.g. routed) between two shielding wires and shielded from any neighbor signal line. In another example of the present invention, the shielding mesh within one layer contains more than five (or seven) parallel shielding wires. The shielding wires in the shielding mesh are energized by more than one reference voltages (e.g., GND and VCC, which are also used for distributing power in the IC). In one embodiment of the present invention, shielding meshes in more than one layer are interconnected so that the average length of the segments of the shielding wires between nodes each of which joins more than two wires in the shielding mesh is not very long (e.g., less than 10-15 times the average spacing between the signal lines within the mesh). In one embodiment of the present invention, the average length of the segments of the shielding wires between nodes each of which joins more than two wires is less than 3 times the average spacing between the signal lines within the mesh. In one embodiment of the present invention, the average length of the segments of the shielding wires between nodes each of which joints more than two wires is substantially less than the average length of the signal lines within the mesh.

Figure 11:
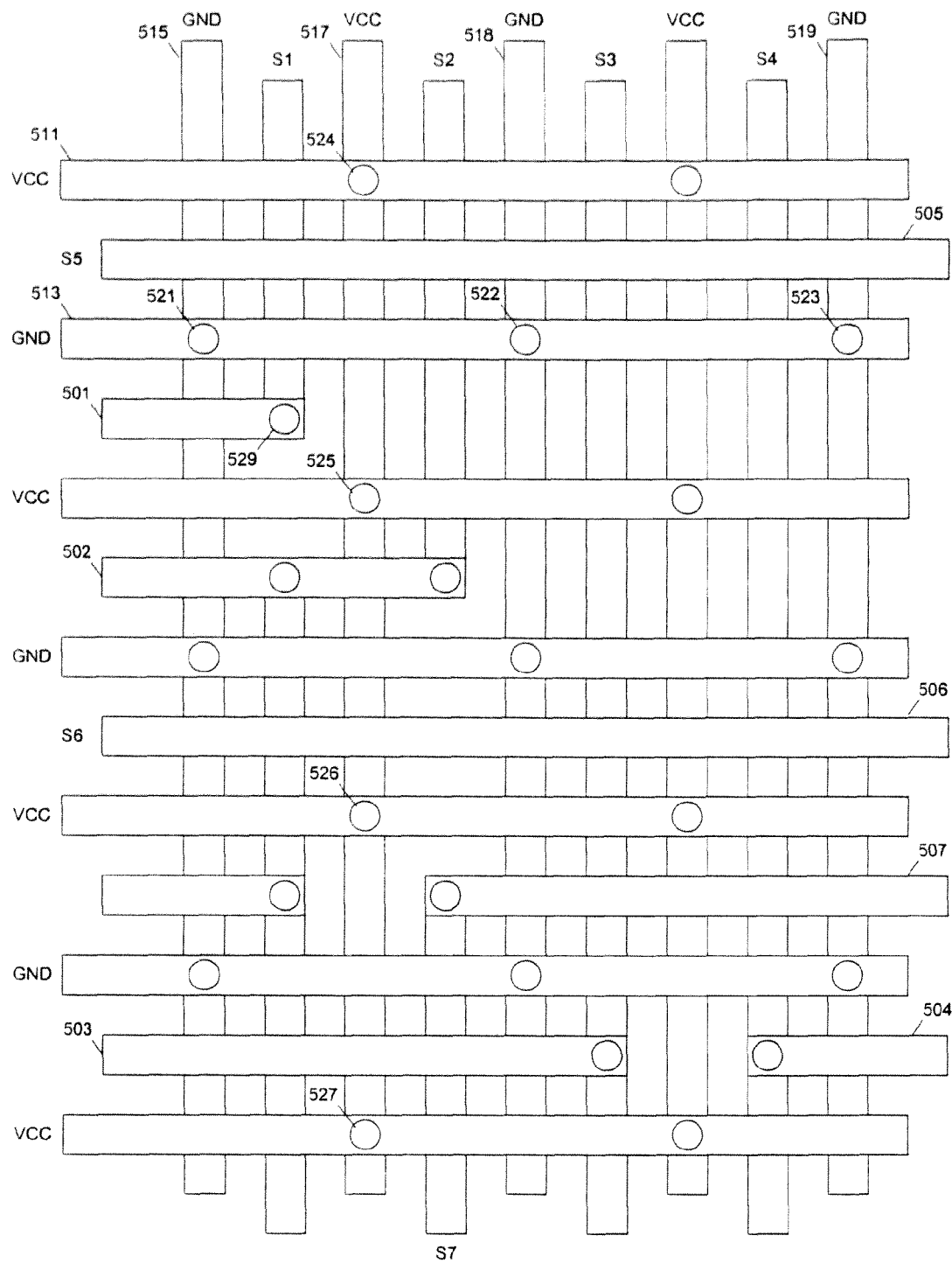
FIGS. 11-13 show detailed examples of signal lines shielded by two-layer shielding meshes according to embodiments of the present invention.
Figure 12:
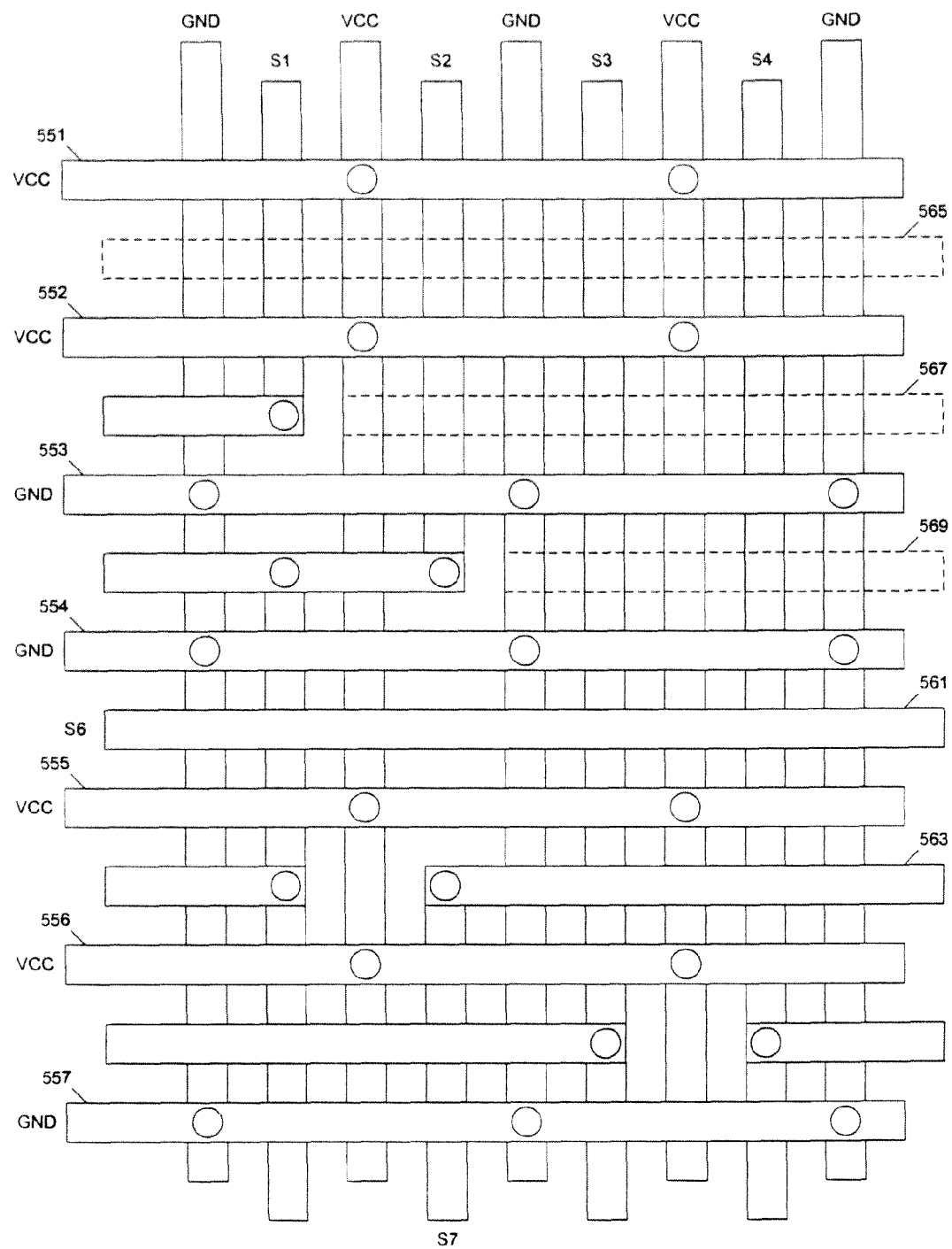
Figure 13:
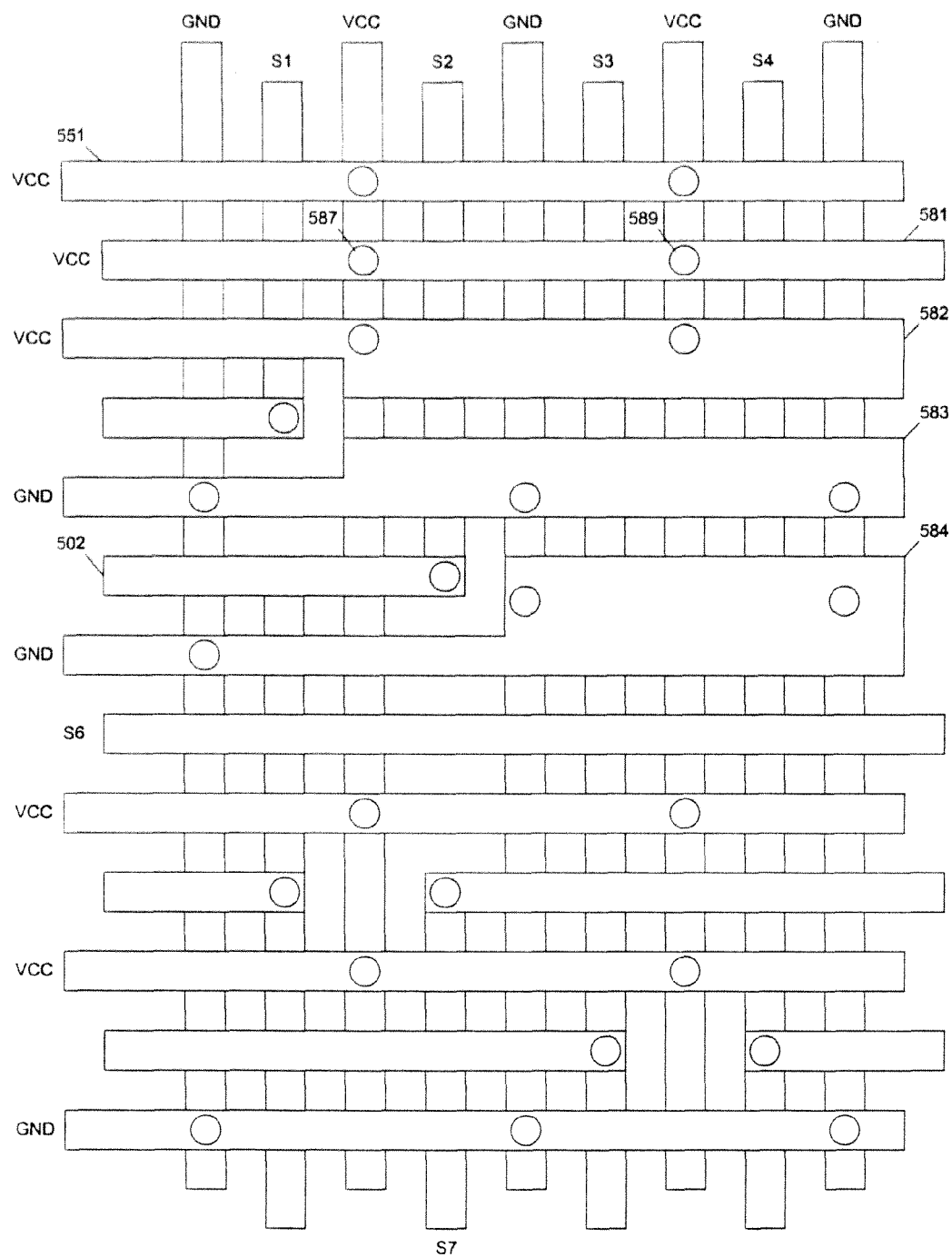

FIGS. 11-13 show detailed examples of signal lines shielded by two-layer shielding meshes according to embodiments of the present invention.

FIG. 11 is a top view of a shield mesh on two adjacent substrate layers. The insulating layer which separates these adjacent substrate layers is not shown. Segments of signal lines (e.g., 501-506 (S1-S6)) are shielded from each other between segments of reference voltage lines (e.g., 511, 513, 515, 517, and others). Vias 521, 522 and 523 connect GND line 513 in the upper layer to GND lines 515, 518 and 519 in the lower layer respectively so that GND line 513 is split into small segments. Similarly, vias 524-527 connect VCC line 517 in the lower layer to corresponding VCC lines in the upper layer (e.g., VCC line 511). Via 529 connects the segment of signal line 501 in the lower layer to the segment of signal line 501 in the upper layer. Each via for the shielding mesh provides a connection between layers and reduces the segment size of the shielding mesh to reduce the effective R-C value. In FIG. 11, a mesh of connected wires for voltage level VCC and a mesh of connected wires for voltage level GND are interwoven to form a shielding mesh, where each segment of the signal lines are shielded between two parallel adjacent reference lines of different voltages (e.g., GND and VCC) from segments of other closest signal lines.

In one embodiment of the present invention, the reference voltage lines in each of the layers are straight lines aligned to form a regular grid; in another embodiment, the reference voltage lines in each of the layers are neither straight nor aligned to form a regular grid. In one embodiment of the present invention, when the reference voltage lines and the signal lines are aligned to a grid, the reference voltage lines are on odd (or even) grid tracks; and the signal lines are routed on the even (or odd) grid tracks. In one embodiment of the present invention, when the reference voltage lines and the signal lines are aligned to a grid across multiple layers, the tracks are so assigned that there is no signal track directly on top of one another in parallel to avoid top bottom coupling. For example, if signals lines on layer N are on odd tracks, signals lines on layer N+2, which has the same routing direction as layer N, are routed on even tracks. This strategy causes the signal lines to be shielded by opposite power/ground not only on the left and right sides, but also on the top and bottom sides. Thus, the segment lengths are reduced; and the effective isolation between signal lines to reduce noise coupling is increased.

When the signal lines and shielding lines in a layer do not form a regular grid, the signal lines in one layer can be traced by shielding lines within the layer and in adjacent layers to provide top and bottom shielding.

In one embodiment of the present invention, the initial shielding mesh is designed (or selected) such that some shielding wires of the same reference voltage (e.g., VCC or GND) are placed next to each other. If a track between shielding wires of the same reference voltage is unused, the space between them can be filled in for conducting the reference voltage, which can dramatically improve the current carrying capacity of the shielding wire. Signal lines are routed between shielding wires of different voltages (e.g., a VCC/GND pair) to leave the tracks between pairs of shielding wires of a same reference voltages (e.g., a VCC/VCC pair, or a GND/GND pair) unused as much as possible. Signals less subjected to corruption can be routed between pairs of shielding wires of a same reference voltage. Different patterns of shielding wires, such as VCC, GND, VCC, GND, GND, VCC, GND, VCC, VCC, may be used for different tradeoff between shielding and current carrying capacity.

FIG. 12 is a top view of a shield mesh on two adjacent substrate layers where reference voltage lines 551-556 in the upper layer are in the sequence of VCC, VCC, GND, GND, VCC, VCC. Two reference voltage lines of the same voltage are placed near each other. A signal line routed between two reference voltage lines of different voltages are better shielded than a signal line routed between two reference voltage lines of the same voltage. Thus, critical signal lines (e.g., signal line 561) are first routed between reference voltage lines of different voltages (e.g., GND line 554 and VCC line 555); and other signal lines that are less sensitive to corruption through cross-talk, etc. (e.g., line 563) may be routed between two reference voltage lines of the same voltage (e.g., VCC lines 555 and 556). After all signal lines are routed, there may be tracks that are not used for routing signal lines. For example, tracks 565, 567 and 569 in FIG. 12 are not used for signal lines, which can be combined with the adjacent reference voltage lines to substantially widen (e.g., double the width) the corresponding reference voltage lines and to reduce their impedances. This combining of lines can be done automatically by computer aided design systems (e.g. systems which use IC routing software to design ICs). For example, track 569 shown in FIG. 12 can be merged with GND line 554 to form wider GND line 584 in FIG. 13; track 567 in FIG. 12 can be shared by VCC line 552 and GND line 553 to form wider VCC line 582 and wider GND line 583 to produce the result shown in FIG. 13; and track 565 in FIG. 12 is used as VCC line after vias 587 and 589 are inserted to connect line 581 to the VCC lines in the lower layer. It is understood that the unused tracks can also be combined with reference voltage lines in other forms. For example, voltage lines 551, 581 and 582 can all be combined into one wider line; and lines 584 and 583 may be combined so that the segment of signal line 502 in the upper layer is shielded by a U-shaped GND wire formed by the wire combined from lines 583 and 584.

When a track (or a portion of the track, e.g., 567 in FIG. 12) between two reference voltage lines of different voltages is not used for routing signal lines, the track can be used to widen the reference voltage lines (e.g., run a separate reference voltage line on the track, or combine the track with one of the reference voltage lines, or share the track by the reference voltage lines), as described above. Under some design rules which have spacing requirements that depend on wire width, it is desirable to run a separate reference voltage wire (e.g., VCC or GND) on the track. The separate reference voltage wire may be of a minimum width. Utilizing the open track between lines of different reference voltages (e.g., VCC and GND) for widening reference voltage lines has the advantage of introducing decoupling capacitance between the reference voltage lines. This approach is particularly useful, when 0.13 micron (and below) technology is used. The traditional way of adding decoupling capacitance is to fill available space with large transistors whose gates are used as capacitors. However, at 0.13 micron and below the leakage current across the gate becomes large, consuming too much power. Additionally, transistor based decoupling capacitance is resistive and is not good for suppressing high frequency noise. The decoupling capacitance introduced in the shielding grid is good for suppressing high frequency noise. Further, when a track (e.g., a portion of track) between two reference voltage lines of the same voltage (e.g., VCC) is not used for routing the signal lines, the track can be used for a line of the same voltage or a line of a different voltage. For example, track 565 between two VCC lines in FIG. 12 can be used for VCC or GND. When the track is used for a reference line of a different voltage (e.g., GND), additional decoupling capacitance is added; when the track is used for a reference line of the same voltage (e.g., VCC), the track can be combined with neighboring references lines (e.g., VCC lines 551 and 552) to further reduce the resistance of the combined reference line. This decoupling capacitance aspect is described further in conjunction with FIGS. 28A, 28B, 29A, 29B and 30.

Figure 28A:
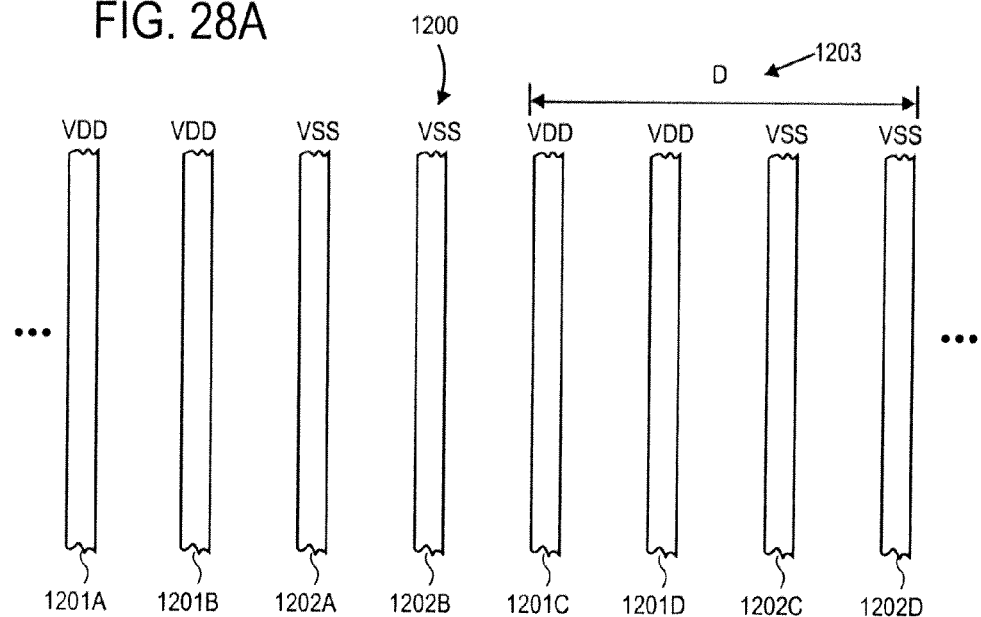
FIG. 28A shows a top view of a shielding mesh of another exemplary embodiment of the invention.
Figure 28B:
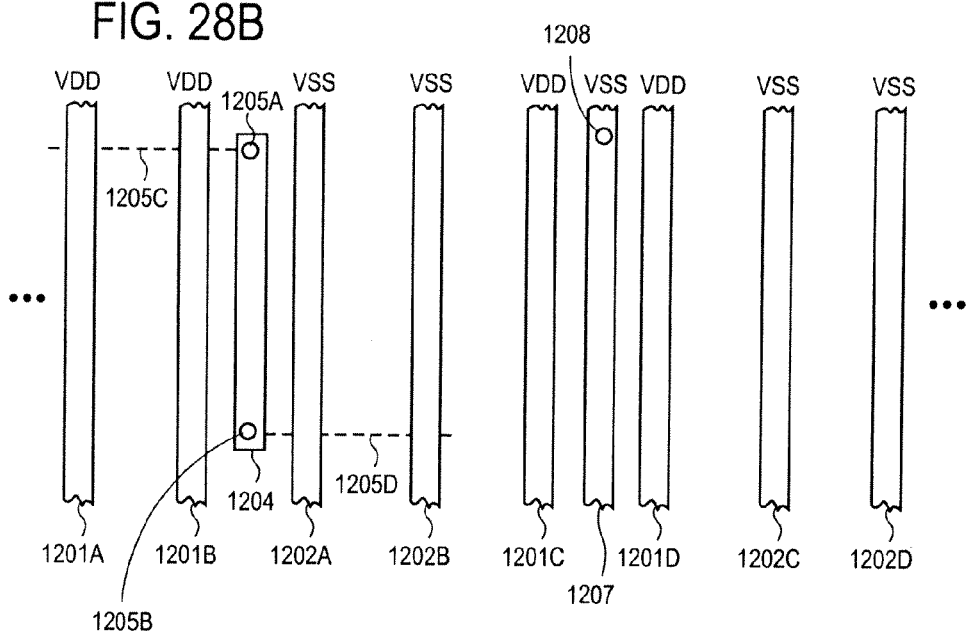
FIG. 28B shows a top view of the shielding mesh of FIG. 28A after a signal line is routed in the mesh and after an additional voltage reference line, for decoupling capacitance, has been routed in the mesh.

FIG. 28A shows an example of a one layer shielding mesh which includes a repeating pattern of at least two adjacent first reference voltage lines (e.g. VDD) and at least two adjacent second reference voltage lines (e.g. VSS). The shielding mesh 1200 shown in FIG. 28A includes four VDD lines (1201A, 1201B, 1201C, and 1201D) and four VSS lines (1202A, 1202B, 1202C, and 1202D). The repeating pattern of two VDD and two VSS and two VDD . . . provides certain advantages which are described below. The shielding mesh 1200 may vary in size depending on the uses of the mesh. The density of the mesh may be very high such that the four lines 1201C, 1201D, 1202C and 1202D may be within a distance D (1203) which is less than 2 microns or smaller. In those instances when the shielding mesh 1200 is used to provide decoupling (e.g. bypass) capacitance, it is usually desirable to use a high density shielding mesh in order to obtain a desired level of decoupling capacitance between adjacent reference voltage lines. In other instances, the shielding mesh may have a lower density (e.g. D may be less than 20 microns or in some cases less than 50 microns). In the case of the shielding mesh 1200, it is used to shield at least one signal line 1204 and to provide at least one decoupling capacitance through an added reference voltage line 1207. This use of shielding mesh 1200 is shown in FIG. 28B. As shown in FIG. 28B, a signal line 1204 has been added to the shielding mesh between VDD reference voltage line 1201B and VSS reference voltage line 1202A. This signal line 1204 is shielded between these two reference voltage lines along its entire length on the layer containing the shielding mesh. It may or may not be shielded in the layers above or below. The signal line 1204 is coupled to lines (e.g. lines 1205C and 1205D) on other layers through connection vias 1205A and 1205B respectively. An additional reference voltage line 1207 has been added between VDD reference voltage lines 1201C and 1201D to provide a bypass or decoupling capacitance between VDD and VSS within the IC on the layer containing this shielding mesh. This additional reference voltage line 1207 provides about twice as much decoupling capacitance as compared to an additional VSS line between a VSS line and a VDD line (e.g. an additional VSS reference voltage line between VSS line 1202B and VDD line 1201C would provide only about one-half as much decoupling capacitance as the additional VSS line 1207 as shown in FIG. 28B). The repeating pattern of 2 VDD lines and 2 VSS lines provides this additional capacitance because an additional reference voltage line of a first polarity, which is designed to add decoupling capacitance, may be inserted between a pair of charged reference voltage lines of a second polarity. The additional reference voltage line 1207 may be coupled to another VSS line through the connection via 1208 (or through another via, not shown, somewhere along the length of line 1207). It will be understood that additional reference voltage lines may be added to increase the amount of decoupling capacitance provided by the shielding mesh, up to a desired amount of decoupling capacitance to be provided by the shielding mesh. Thus, for example, if more decoupling capacitance is desired even after line 1207 has been added, an additional reference voltage line may be added (e.g. an additional VDD line may be added between VSS lines 1202A and 1202B and an additional VSS line may be added between VDD lines 1201A and 1201B). The shielding mesh 1200 may be used exclusively for providing decoupling capacitance if no signal lines need to be shielded in a particular design.

Figure 29A:
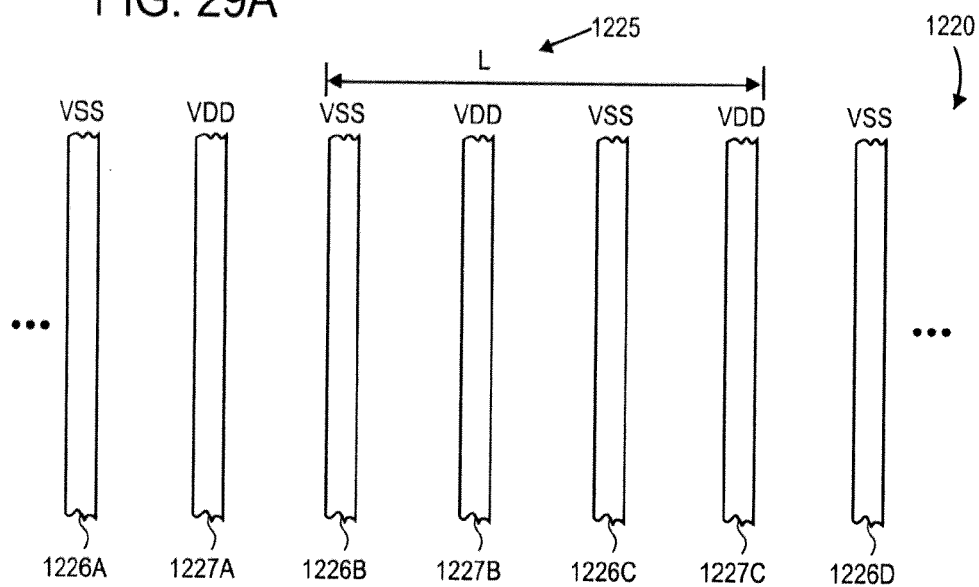
FIG. 29A shows a top view of another shielding mesh.
Figure 29B:
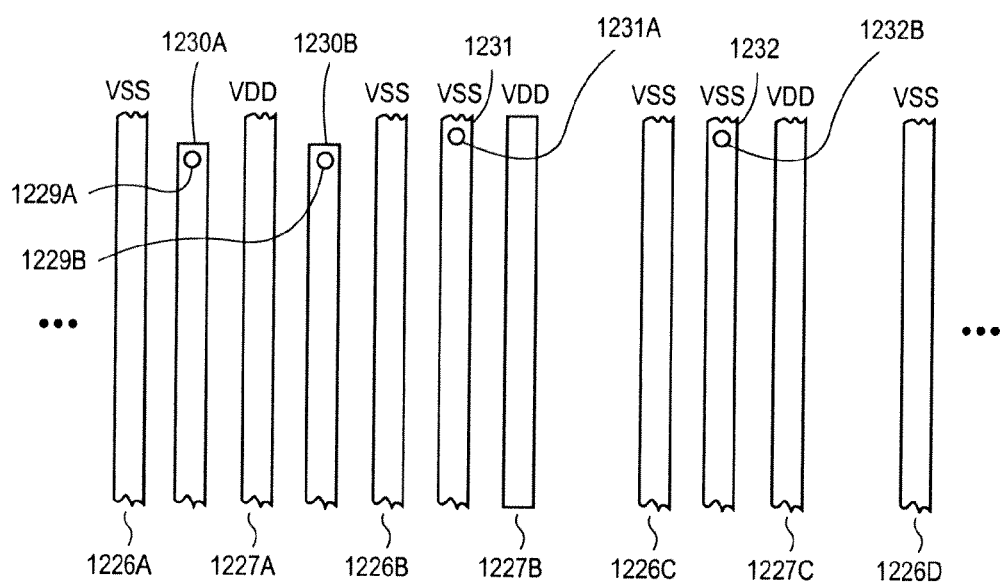
FIG. 29B shows a top view of the shielding mesh of FIG. 29A after signal lines have been routed in the mesh and after additional voltage reference lines, for decoupling capacitance, have been routed in the mesh.

FIGS. 29A and 29B show another example of a shielding mesh which includes shielding for signal lines and decoupling capacitance. The shielding mesh 1220 includes in a single layer of an IC a first plurality of lines 1226A, 1226B, 1226C, and 1226D which are designed to provide a first reference voltage (VSS in this case) and a second plurality of lines 1227A, 1227B, and 1227C which are designed to provide a second reference voltage (VDD in this case). The shielding mesh may have a high density which is useful when the mesh is also used to provide decoupling capacitance. The density may be defined by the number of lines (or portions of lines) within an area or the number of parallel lines intersecting a linear distance, such as the distance L (1225) in FIG. 29A. The distance L may have the same range as D (in FIG. 28A) over a variety of different designs. FIG. 29B shows the shielding mesh 1220 after two signal lines, 1230A and 1230B, and two additional reference voltage lines, 1231 and 1232, have been added to the shielding mesh as a result of a computer aided design process. Each of the signal lines 1230A and 1230B have been shielded between an adjacent pair of opposite reference voltage lines. For example, signal line 1230A is shielded between VSS line 1226A and VDD line 1227A. Connection vias 1229A and 1229B respectively provide electrical contact to an adjacent layer for signal lines 1230A and 1230B. The shielding mesh of FIG. 29B also includes two additional reference voltage lines 1231 and 1232 which are respectively coupled to an adjacent layer through connection vias 1231A and 1232B. The additional VSS reference voltage line 1231, in conjunction with VDD line 1227B, provides a decoupling capacitor. The additional VSS reference voltage line 1232 and the VDD line 1227C provide another decoupling capacitor. It will be appreciated that the remaining slots (between the original reference voltage lines of the mesh) may be used to add further additional reference voltage lines to increase the decoupling capacitance provided by the shielding mesh.

Figure 30:
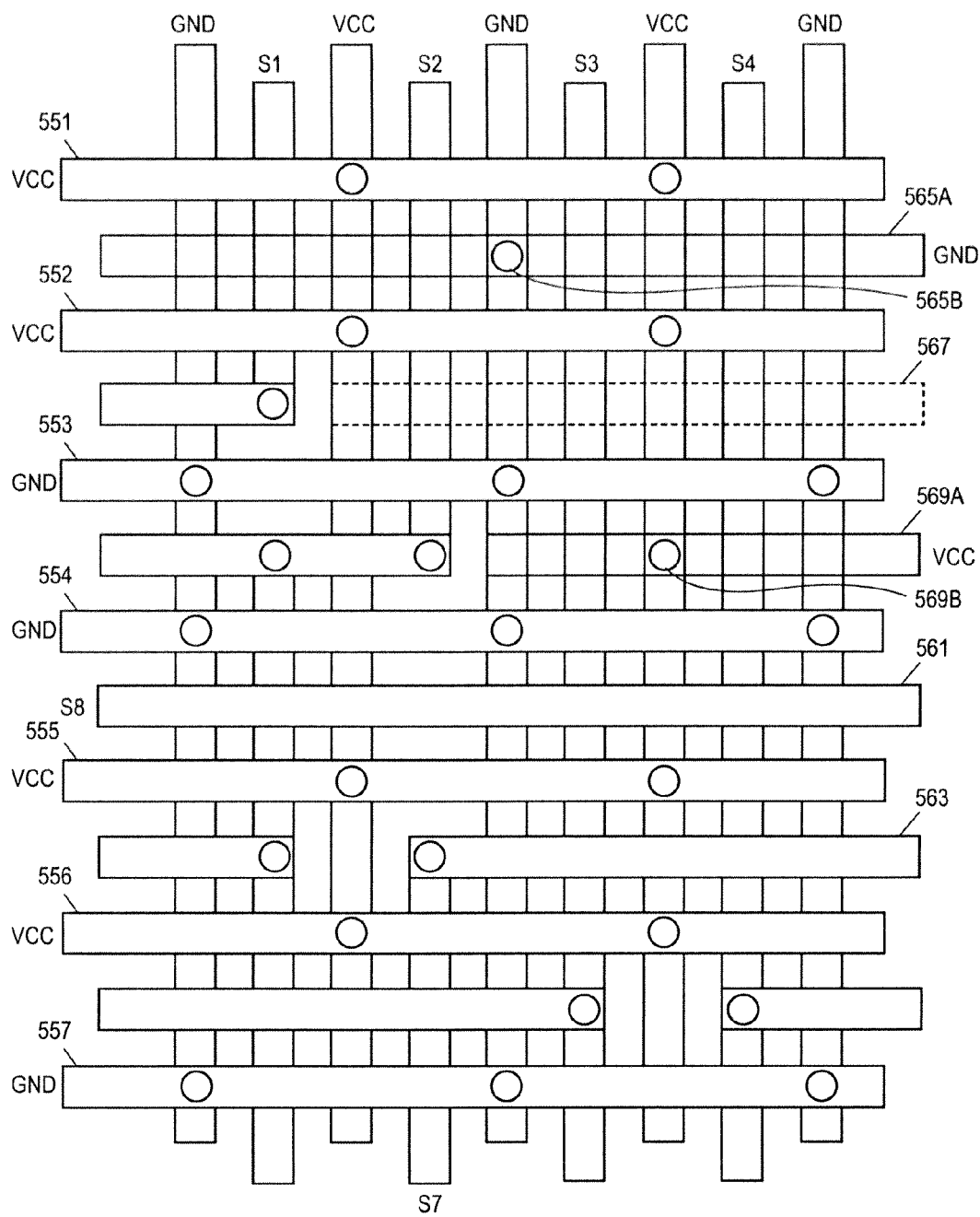
FIG. 30 shows a top view of a two layer shielding mesh (without showing an intervening insulating layer) which is similar to the shielding mesh of FIG. 12.

FIG. 30 shows another example of a shielding mesh. This shielding mesh is the same as the mesh of FIG. 12 except that a ground (GND) reference voltage line 565A has been added and a VCC reference voltage line 569A has been added to provide decoupling capacitance. The VCC line 569A is electrically coupled, through a connection via 569B, to another VCC line. The ground reference line 565A is electrically coupled, through a connection via 565B to another GND line.

Some embodiments of the present invention use a mesh of wires both to distribute power and to shield signals. In a typical IC, the wires for distributing power take a significant portion of routing resource. When the shielding wires are also used for distributing power, the area cost for shielding can be reduced significantly.

Figure 14:
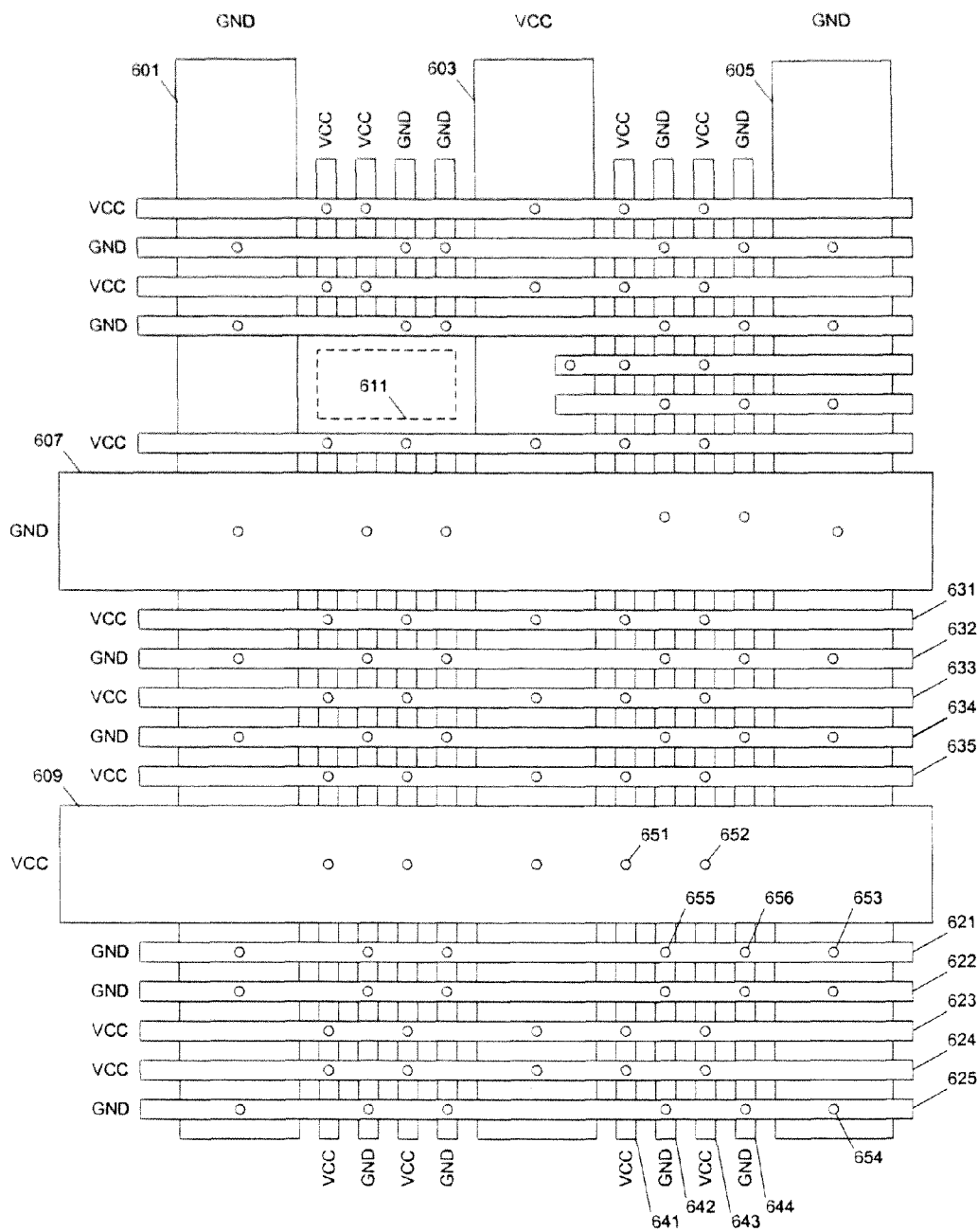
FIG. 14 shows a detailed example of a two-layer shielding meshes connected with a power grid according to one embodiment of the present invention.

FIG. 14 shows a detailed example of a two-layer shielding meshes connected with a power grid according to one embodiment of the present invention. The power grid has wider lines 601-605 and 607-609 to deliver power and ground to the IC circuit; and, the shielding meshes (e.g., a mesh formed by lines 621-625 and lines 641-644) has narrower reference voltage lines to shield signal lines (not shown in FIG. 14)) routed in between the narrower reference voltage lines. The shielding lines (e.g., 641, 643, 621 and 625) tap into the power grid (e.g., through vias 651, 652, 653 and 654) to provide shielding and power; and other vias in the shielding mesh (e.g., vias 655 and 656) couple the lines in the mesh to one of the two reference voltages (e.g. VCC or ground). Due to the relatively small segment lengths between certain vias (e.g. vias 655 and 656), the shielding mesh functions to reduce the effective RC component of the lines being connected to, which in turn reduces the noise and coupling effect. The shielding mesh can be deployed on any substrate area where routing resources are used. The ratio in width between the power grid lines (e.g., line 605) and the shielding mesh lines can be a factor from 2 to 10, or more. In one embodiment of the present invention, a typical shielding wire is of the size (width and/or thickness) of a typical signal line.

In FIG. 14, it is seen that different regions may use different types of shielding meshes. For example, shielding wires 631-635 shield each of the tracks between an adjacent pair of the wires with different voltages (in other words a track for a signal wire between lines 631 and 632 is a track that shields the signal wire between two different reference voltages, VCC and GND); however, shielding wires 621-625 shield some tracks (e.g., between lines 621 and 622) between two of the wires with the same reference voltage.

A shielding mesh can be used in the routing channel between blocks on a substrate and also within a block of a substrate. Due to relatively small segment lengths of the shielding mesh, the shielding mesh reduces the effective RC component of the routing line and the noise and coupling effects caused by cross talk between signal lines.

In some congested regions, such as region 611 in FIG. 14, a window in the shielding mesh can be used to make room for routing signal lines in the window. In such windows, the signal lines are not shielded (or may be shielded at a lower shielding density than the shielding density outside of the window); and conventional methods can be used in the window to route signal lines to avoid signal integrity problems. Typically, the window in a layer of shielding mesh is used to route lines from other layers.

The shielding mesh near local congestion areas can be replaced with a window surrounded by a power ring. The area within the power ring, the window in the shielding mesh, may be completely unshielded and is taken into account for any wire routed through the window. The number of available tracks within the window is increased up to double the number of tracks available for routing signals. A sparser set of shielding wires, (e.g. a lower shielding density) such as those illustrated in FIGS. 7 and 8, can be used in the window. The creation of such windows in layers of shielding mesh can be done automatically by computer aided design systems, such as systems which use IC placement and routing software to design ICs.

For each wire routed through or in the window of the shielding mesh, it can be determined whether or not the coupling between adjacent signal lines may causes signal integrity problems. For example, an RLC model can be used to determine if the signal can be corrupted by coupling from other signal lines (or power/ground current, if the shielding lines are connected to the power/ground grid).

The congestion level (e.g. for routing signal lines) can be estimated by computer aided design systems in an early stage of routing or determined after an actual routing operation, which may be successful or not. Upon determining that the level of congestion has become unacceptable (e.g. the wiring density exceeds predetermined design rules), the computer aided design system can then introduce ("open") a representation of a window in a shielding mesh in order to route wires within the window. The computer aided design system can then route signal wires within the window in order to reduce the level of congestion.

Figure 15:
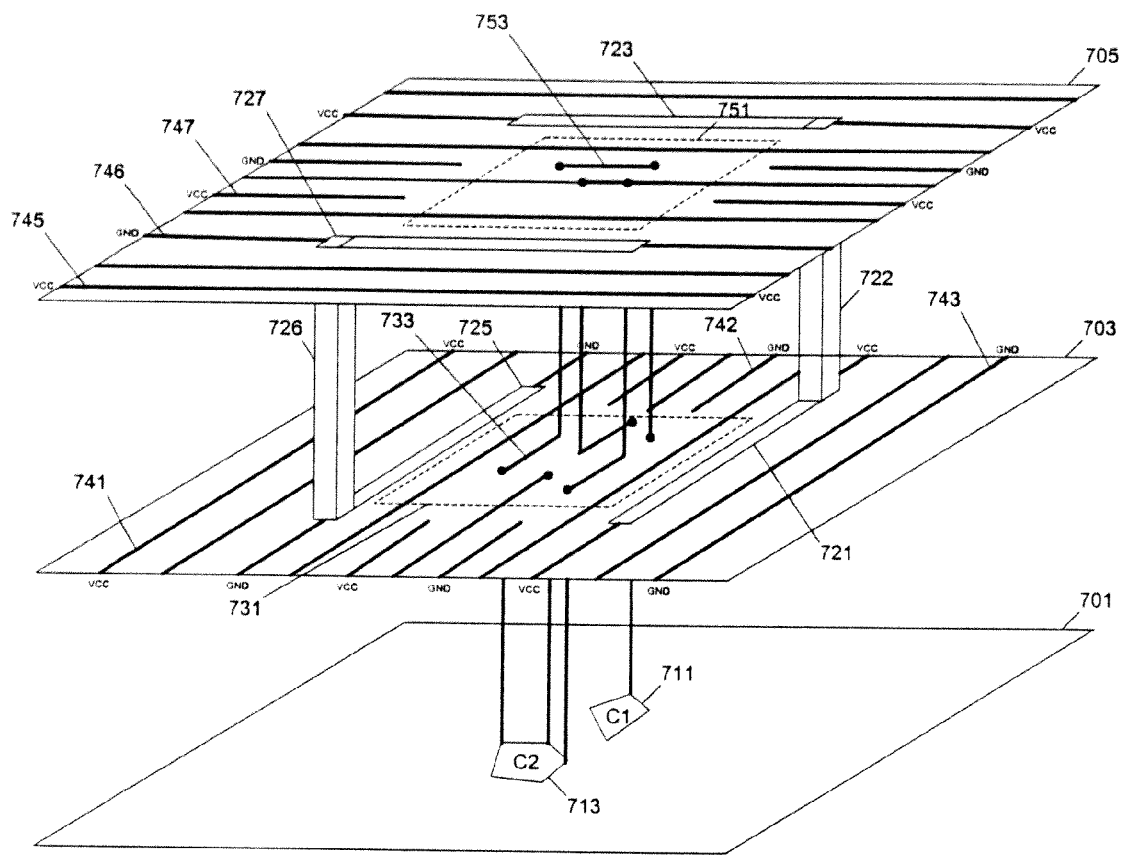
FIG. 15 shows a perspective view of a two-layer shielding mesh with a window for unshielded signal lines according to one embodiment of the present invention.

FIG. 15 shows a perspective view of a two-layer shielding mesh with a window on each layer of shielding mesh for unshielded signal lines according to one embodiment of the present invention. Cells (e.g., gates 711 and 713) on layer 701 on a substrate are connected through signal wires (e.g., lines 753 and 733). Within windows 751 and 731, signal lines are not shielded by shielding wires. Without shielding wires in windows 751 and 731, more resources (e.g. physical space on at least one layer of the IC) are available to route the signal lines. Outside windows 751 and 731, shielding wires (e.g., lines 741, 742, 743, 745, 746, 747) are used to provide shielding to the signal lines running in the tracks between the shielding lines. Around the windows, wide power lines (e.g., lines 721 and 723 connected through via 722 for VCC and lines 727 and 725 connected through via 726 for GND) are used to provide power to the region in the window and to reduce the impedance caused by the window in the mesh.

Figure 16:
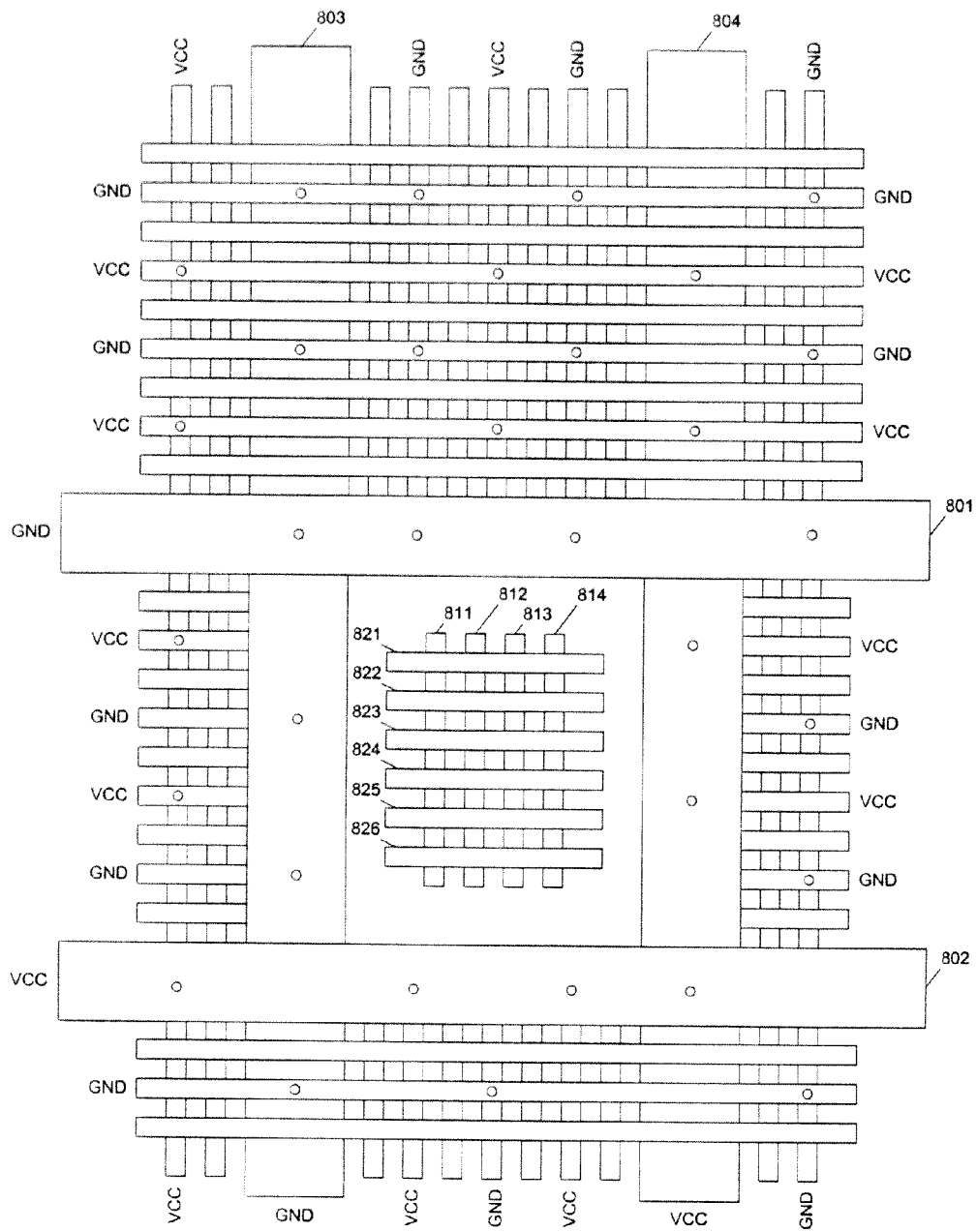
FIGS. 16-18 shows in top views detailed examples of two-layer shielding meshes with windows for unshielded signal lines according to embodiments of the present invention.
Figure 17:
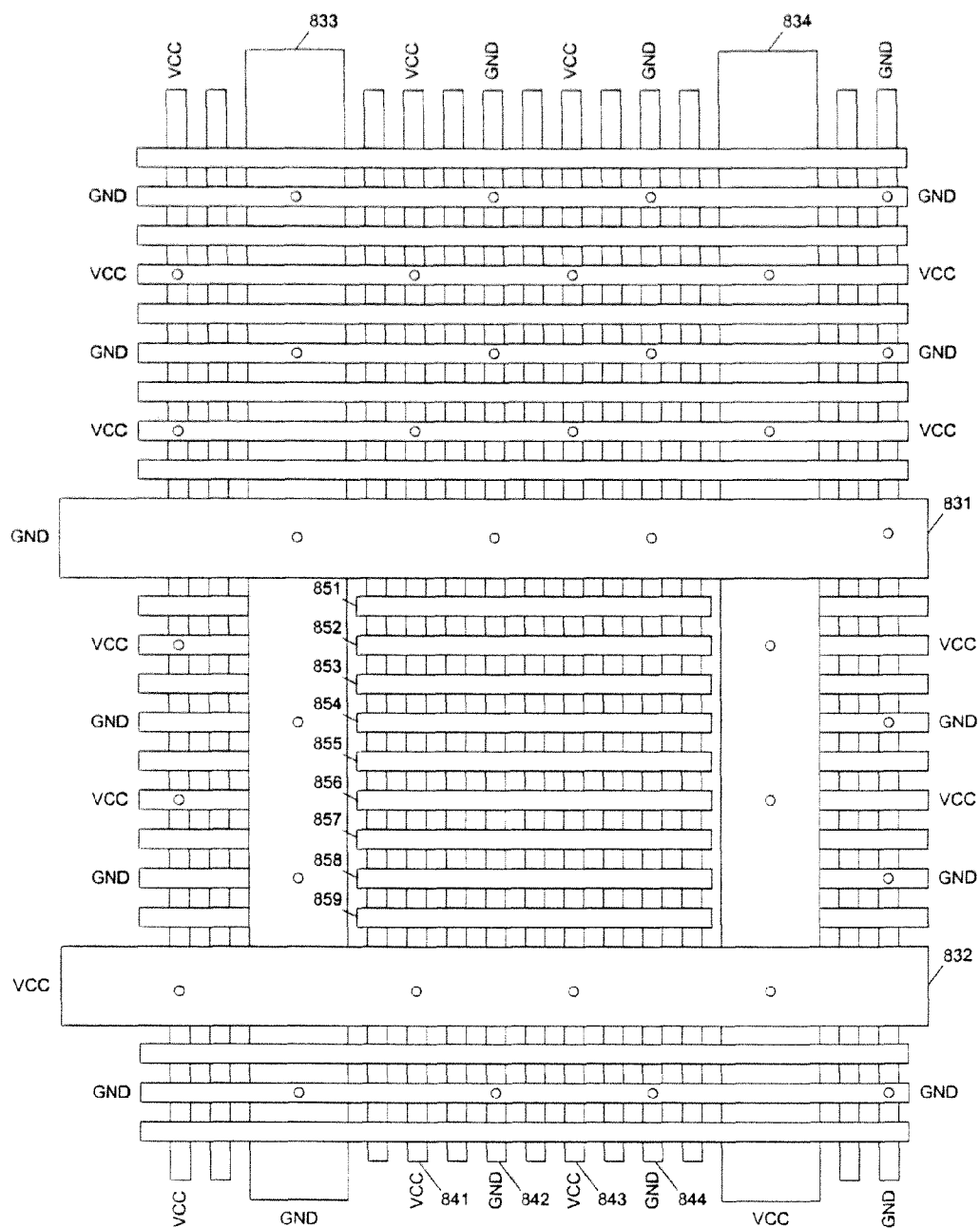
Figure 18:
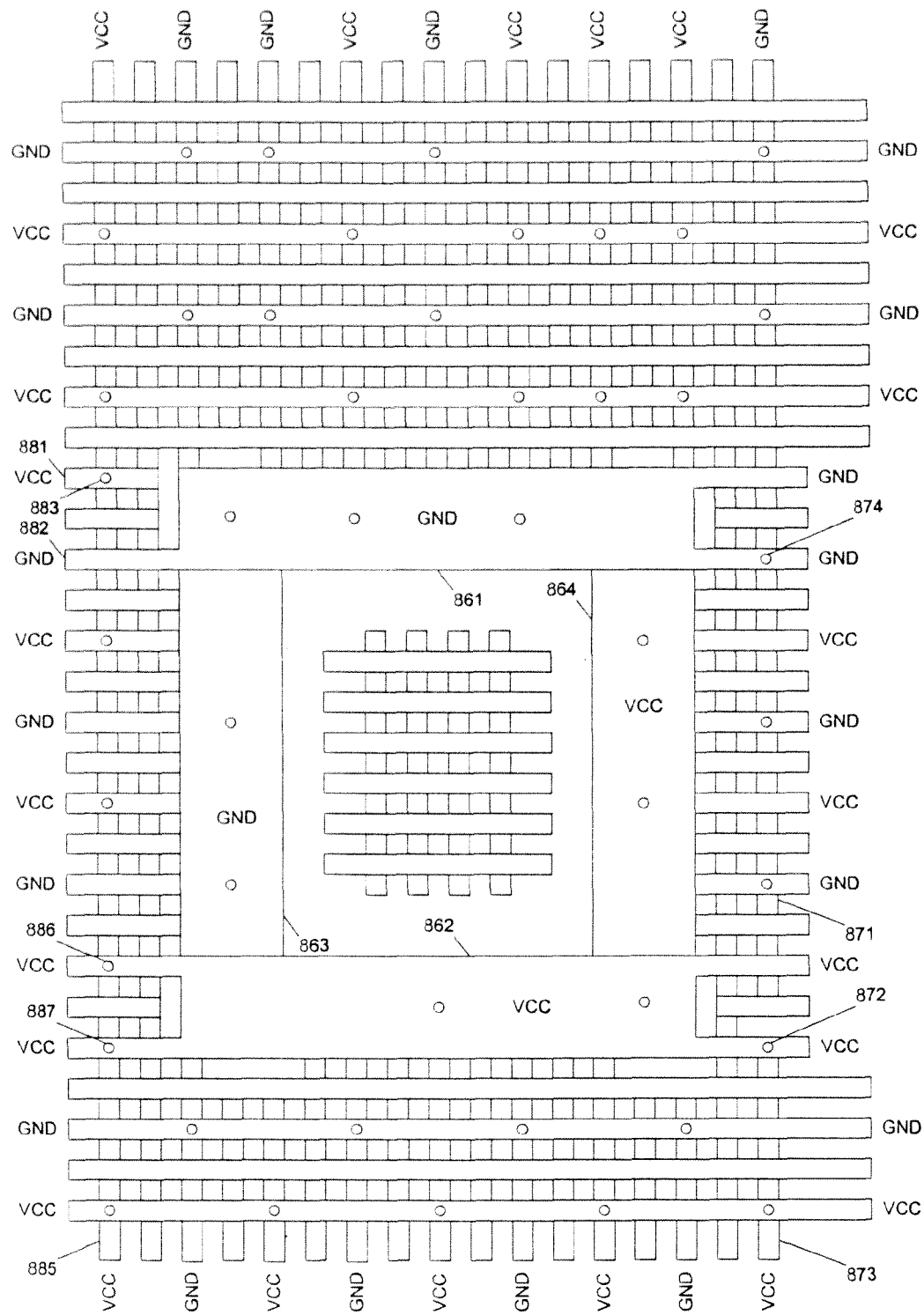

Although FIG. 15 illustrates two windows of the same size in a two-layer shielding mesh, the sizes of the windows in the two layers can be different. Further, a single layer of shielding mesh (without a second layer) may use a window. FIGS. 16-18 shows in top views detailed examples of two-layer shielding meshes with windows for unshielded signal lines according to embodiments of the present invention.

In the example of FIG. 16, a window is formed in a power grid between lines 801, 802, 803 and 804. Both the upper layer and the lower layer have the same window size. Tracks 811-814 in the lower layer and tracks 821-826 on the upper layer are all used to route signals from other layers, such as layers above tracks 821-826 and layers below the lower layer. In the example of FIG. 17, the window is only in the upper layer, where tracks 851-859 are used for routing signal lines to/from, for example, layers above tracks 851-859; and, the shielding mesh of lines 841-844 in the lower layer has no window between power grid lines 831, 832, 833 and 834. In the example of FIG. 18, a power ring of wide wires 861, 862, 863, and 864 are formed by combining adjacent reference voltage lines and the tracks in between so that the wires for the power ring are substantially wider (e.g., more than 2 to 5 times the width of an typical signal line). The power ring provides current flows around the windows to reduce (or compensate) the impedance in the shielding mesh caused by the window. VCC line 873 is connected to line 862 of the power ring through via 872. VCC line 873 is not connected to GND line 871; and GND line 871 taps into line 861 of the power ring through via 874. GND line 882 is connected to line 861 of the power ring; however, VCC line 881 is not connected to line 861 of the power ring. Instead, via 883 connects VCC line 881 to VCC line 885, which taps into the power ring through vias 886 and 887. Thus, different types of shielding meshes outside the power ring are formed by selectively placing the vias for connecting the shielding wires in different layers, selectively connecting or disconnecting shielding wires at certain locations, and selectively combining tracks.

From this description, it can be seen that a window in the shielding can be on a single metal layer (e.g., the layer of the horizontal lines in FIG. 17) or at the same location on two neighboring metal layers (e.g., the layers of the horizontal lines and vertical lines in FIG. 16). Further, it is understood that the windows on neighboring metal layers may not be at the same location and may not be of the same size. The windows on neighboring metal layers can have different sizes and partially overlapping with each other. It is desirable, but not always required, to constrain the size of the window such that the maximum length of a signal line in the window is less than an allowable unshielded length of the signal line. In this way, any unshielded signal lines in the window are not impacted enough by neighbors in the window. If a window is sized in this way, signal lines may be routed in the window without worrying about (or calculating parameters relating to) signal integrity (at least for the portion of the signal line in the window).

Although various examples of the present invention are illustrated using the routing architecture where the lines in the two neighboring layers are routed in a rectilinear way (e.g. the lines in one layer are at an angle of 90 degrees relative to the lines in the other (e.g. next) layer), it is understood that various embodiments of the present invention can also be used for different routing architectures. For example, the lines of two neighboring layers can be in an angle of, for example, 45 degrees so that the lines in one of the layers are routed in a diagonal direction. For example, in an X architecture (e.g., developed by Simplex, now Cadence) wires in a set of metal layers of a chip are routed in a direction that is 45 degrees from the standard architecture. It is understood that various embodiments of the present invention can be used with different angles of routing directions, regardless of the relative orientation between layers. For example, the wires in the first few (shielded) layers are routed in horizontal/vertical directions; and then, the wires in a shielded pair of layers are routed in diagonal directions (e.g., 45 degrees from the horizontal/vertical directions).

Figure 32:
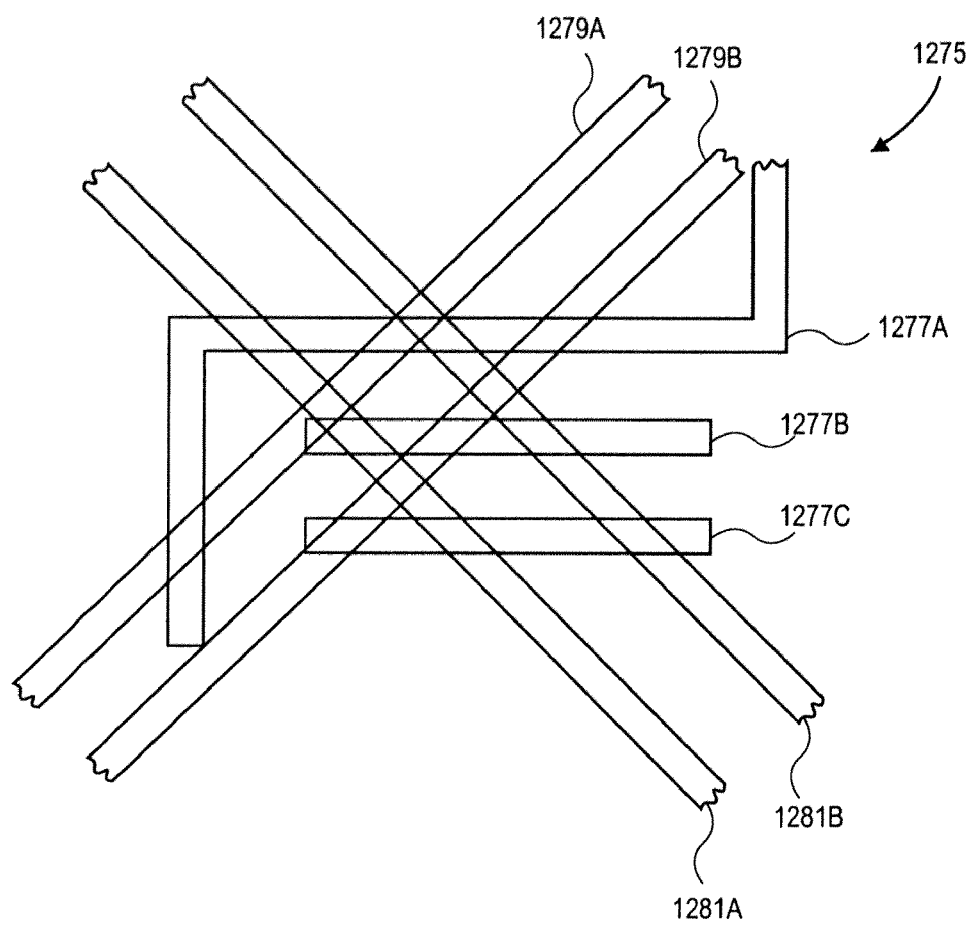
FIG. 32 shows a top view of two layers of a shielding mesh relative to two other layers (such as two other metal layers, e.g. "metal 2" and "metal 3" layers).

FIG. 32 shows an example of a routing architecture of an IC in which at least a first layer and a second layer have conductive lines (e.g. lines 1277A, 1277B, and 1277C) which are routed substantially orthogonally relative to a first reference axis and a second reference axis and in which at least two additional layers comprise a shielding mesh which includes conductive lines (e.g. lines 1279A, 1279B, 1281A, and 1281B) routed substantially non-orthogonally relative to the first and second reference axes. In the example of FIG. 32, lines 1277A, 1277B and 1277C may be lower metal layers (e.g. second and third metal layers in an IC) and lines 1279A and 1279B may be in the fourth metal layer of the IC and lines 1281A and 1281B may be in the fifth metal layer of the IC. It will be appreciated that FIG. 32 is a top view of a portion of an IC which is transparently rendered (such that lower metal layers can be seen). It can be seen from FIG. 32 that lines 1277A, 1277B, and 1277C are routed substantially orthogonally relative to first and second reference axes which may be the edge of the IC. Lines 1279A and 1279B are routed at a non-orthogonal angle (e.g. about 45°) relative to these two reference axes, and lines 1281A and 1281B are also routed at a non-orthogonal angle relative to these two reference axes. While the non-orthogonal angle may be about 45°, it be appreciated that other angles may be used.

Figure 19:
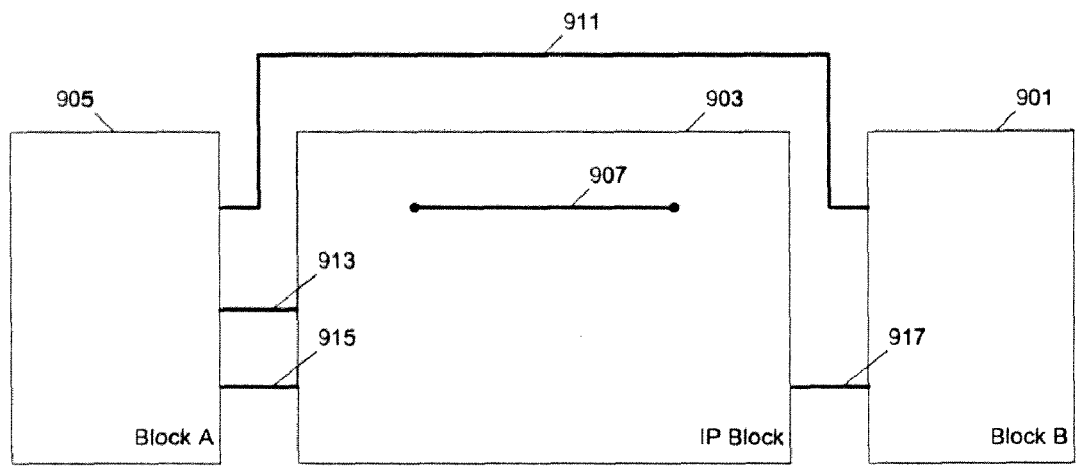
FIG. 19 shows an example of signal lines routed in the presence of an IP block without a shielding mesh.

FIG. 19 shows an example of signal lines routed in the presence of an IP (Intellectual Property) block without a shielding mesh. An IP block is a block of pre-designed circuitry, typically purchased or licensed from a vendor. This predesigned block is normally completely designed and laid out and completely routed (e.g. the internal routing of signals within the block are done and cannot be re-routed). There is typically a first designer which has designed the IP block which will then be used as a building block for a larger design which includes the predesigned block. For example, the design of the circuitry for scanning a keyboard (e.g., an Intel 8051 microcontroller like block) can be purchased and incorporated as a "black box" in an IC on a substrate. Other examples of such predesigned blocks include memory blocks from Virage Logic or logic cores (blocks) from ARM. Certain aspects of an IP block are typically unknown to the designer of the IC which is to incorporate the EP block so that any interference to the circuitry of the IP block would be avoided to preserve signal integrity. For example, blocks 905 and 901 are connected to IP block 903 through wires 913, 915 and 917. Signal line 911 connects blocks 905 and 901. Since certain aspects of the IP block are not known when designing the IC chip, it cannot be easily determined whether or not a signal wire that does not belong to the IP block can cause signal integrity problems when the signal wire is routed through or over the IP block. If the wire is routed through or over the IP block, capacitive and inductive coupling between the wire and the wires of the IP block (e.g., signal line 907) may cause signal integrity problems. Thus, a conventional method typically routes the wire (e.g., line 911) around the IP block, as shown in FIG. 19, rather than over the IP block. It can be seen from FIG. 19 that the IP block includes at least one routing layer for routing signals within the IP block and also for connecting the IP block to blocks (e.g. logic) outside of the IP block.

According to embodiments of the present invention, long routes for IP blocks can be routed in a shielding mesh through/over the IP block in, for example, a shielding layer that is an integral part of (and designed as part of the) predesigned block; and channels in the shielding mesh can be used for signal lines that do not belong to the IP blocks (e.g. signals that are not directly connected to the IP block or are not originating from the IP block), because there is no danger of coupling when the signal lines are shielded in the mesh within the IP block. Alternatively, a virtual route can be performed, where each route has abound on a function of resistance and capacitance along the route through the shielding grid; and these routes are then completed as part of the chip top level routing. This provides more flexibility for top level routing. A successful independent route of the IP block can be used as a starting point to guarantee success in routing for the IP block.

Figure 20:
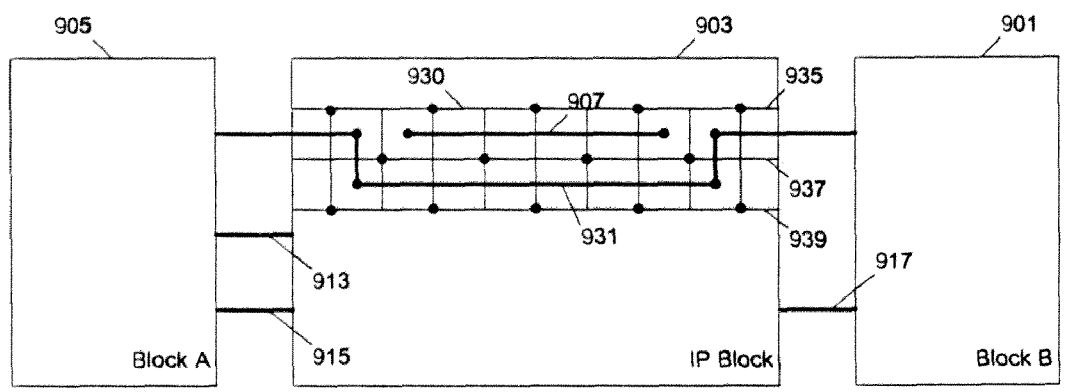
FIGS. 20-21 shows examples of signal lines routed through a region for an IP block in a shielding mesh according to embodiments of the present invention.
Figure 21:
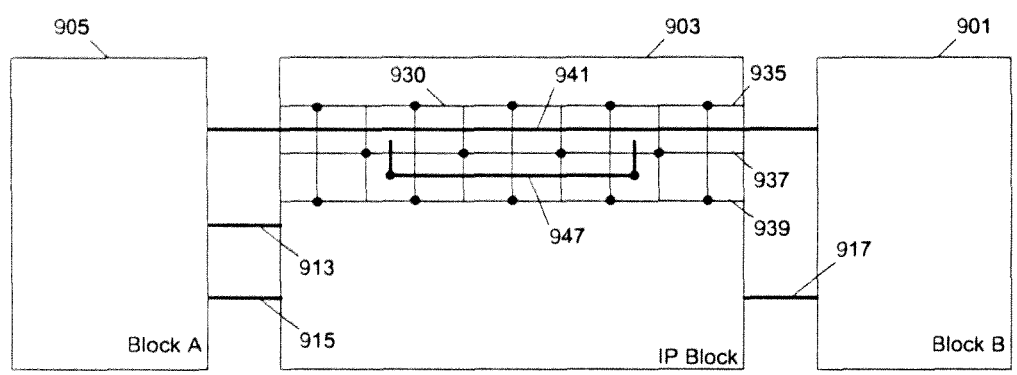

FIGS. 20-21 shows examples of signal lines routed through a region for an IP block in a shielding mesh according to embodiments of the present invention. In the top view of the IC in FIG. 20, shielding mesh 930, which is designed as an integral part of the predesigned IP block, is used to shield the wires (e.g., line 907 which originates in block 903 and ends in block 903) of IP block 903. When the design of block 903 is completed and ready to use in a larger design, the block 903 includes a completely laid out routing architecture except for an integral shielding layer (or layers) which is used to route lines originating in the block 903 or ending in the block 903 as well as lines which are not part of the block 903, such as signal lines which originate from another block and which are not directly connected to circuitry in block 903. Thus, while nearly all of the design of block 903 is completed and generally not revisable in the process of incorporating the block 903 into a larger design, an integral shielding layer in block 903 is capable of being changed. Reference voltage wires (e.g., lines 935, 937 and 939) are added into the routing area (a shielding mesh 930) of the IP block to shield signal lines. Signal line 931 for connecting blocks 905 and 901 is routed in shielding mesh 930 which is a two layer shielding mesh. Since signal line 931 is shielded from the signal lines (e.g., line 907) of the IP block, signal line 931 can be routed through the region for the IP block without signal integrity problems. Although FIG. 20 shows only an example where a signal line from outside an IP block is routed through the region of the IP block in a shielding mesh, it is apparent from this description to one skilled in the art that a shielding mesh can be used in many different ways to shield the signal lines that do not belong to the IP block from the wires of the IP block. For example, the shielding mesh can be in layers above the layers for routing the wires of the IP block; and a signal line for other blocks is routed in the shielding mesh above the IP block (e.g., a shielding line that runs in parallel with the signal line in a layer below the signal line can be used to shield the signal line from the signal lines below the shielding line; more details about inter-layer shielding are illustrated in FIG. 5). Further, wires of the IP block can be re-routed in the shielding mesh. FIG. 21 shows such an example, where wire 947 of IP block 903 is re-routed. The resistances (and/or capacitances) of the re-routed wires may be determined to prevent significant changes in the properties of the re-routed wires.

In addition to running signals at risk in the shielding grid, one can also limit the maximum unshielded run of high edge rate signals. In order to know the maximum unshielded length of a signal, one can create an RLC (Resistance, Inductance and Capacitance) model of the driver, wire, neighbor wires and associated coupling. The neighbors are known as aggressors and the signal being routed is known as the victim. The worst case edge rate (or current ramp for inductance) is inputted into the model to see of it causes a signal integrity problem. The maximum unshielded length for the signal being routed (victim) can then be reduced so that the signal integrity is preserved. One way to increase the maximum unshielded length is to limit the edge rate (or the di/dt for inductance) of the aggressors, by requiring them to be shielded. Clock nets, for example, have both high currents and edge rates and should therefore run shielded for most of their length. Other high fanout signals could have high currents even if they have moderate edge rates.

In order to achieve a complete route, it may be necessary to leave a number of signals somewhat over the risk threshold. In these cases, signal integrity can be achieved by existing techniques such as buffering/sizing the driver, picking alternate neighbor signals that do not transition at the same time as the potential victim, spacing the wire farther from other wires, widening the wire for part of its length to lower resistance, or dropping in a shield wire which can be easily connected to the shielding grid above or below. This will be much easier because the risk level has been dramatically reduced by partial use of shielding on the victims.

Figure 22:
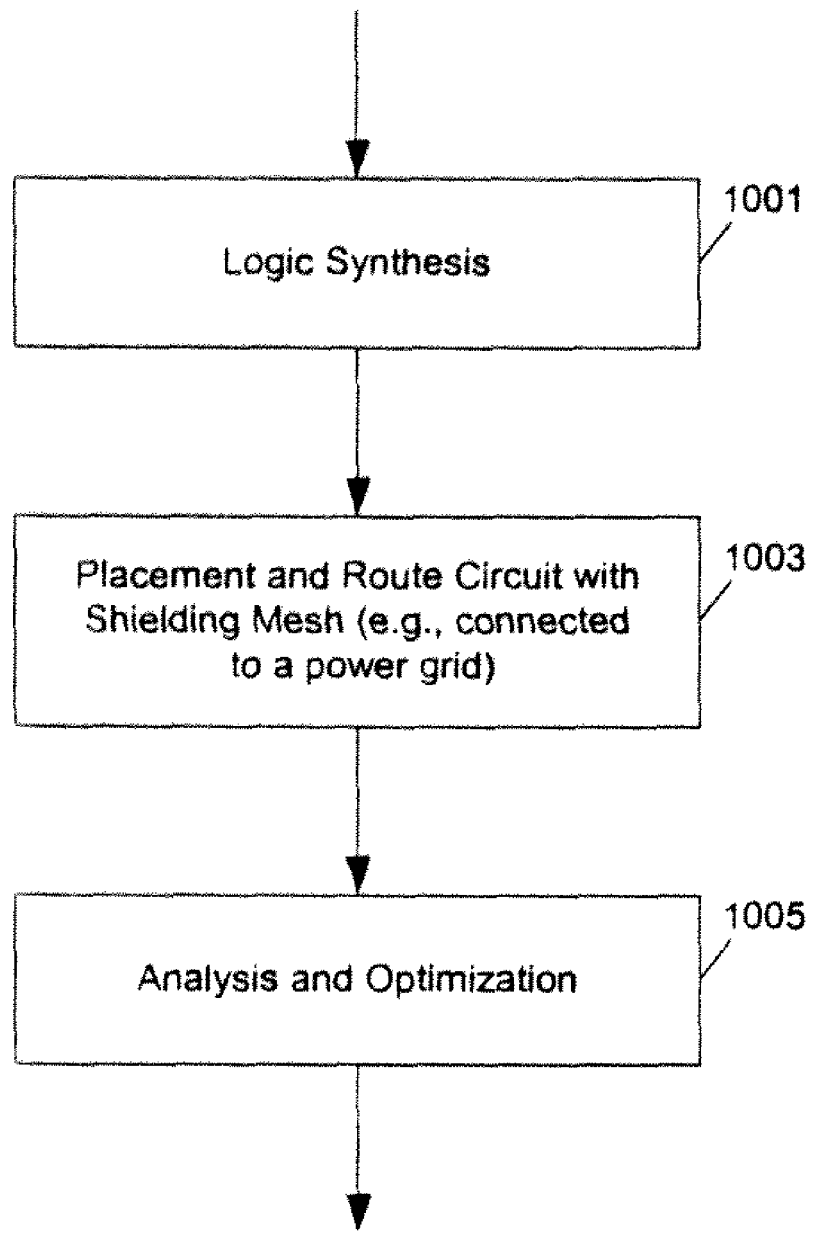
FIG. 22 shows a flow diagram of designing an integrated circuit according to one embodiment of the present invention.

FIG. 22 shows a flow diagram of designing an integrated circuit according to one embodiment of the present invention. The process can begin with the creation of a description of the desired circuit in a Hardware Description Language (HDL) which is known in the art. This description can then be compiled to yield another description such as a Register Transfer Level (RTL) description which can then be further processed in a logic synthesis process. Operation 1001 performs logic synthesis to create a logic element network that performs a given set of functions. The logic synthesis operation may transform and restructure the logic to optimize delays, areas and other design goals. The gate-level logic elements are mapped to vendor specific primitives which are placed in blocks on the chip. Operation 1003 places the vendor specific primitives on the chip and routes the wires between the primitives. At least a portion of the wires are routed in a shielding mesh, which is energized by at least two different voltages. Operation 1005 performs analysis and optimization to meet various design requirements, such as timing requirements, and to optimize performance. In place optimizations are typically performed to optimize timing by changing the physical characteristics (e.g., size) of the logic elements without changing the placement of the logic elements. In place optimizations typically tweak transistor sizes without moving the logic elements around. A timing analysis is typically performed based on the detailed placement and routing information to determine whether or not the timing requirements are satisfied. Some (or all) of operations 1001-1005 may be repeated in iterations to satisfy the design requirement and to optimize the design. The design process of FIG. 22 may be used with any of the various methods and processes described herein to produce an IC which includes a shielding mesh, and this design process may be performed with a computer aided design system which stores and manipulates digital representations (e.g. HDL listings, unplaced netlists, placed netlists, etc.) in the system. The representation includes information about the shielding mesh and routing of wires through the shielding mesh.

Figure 23:
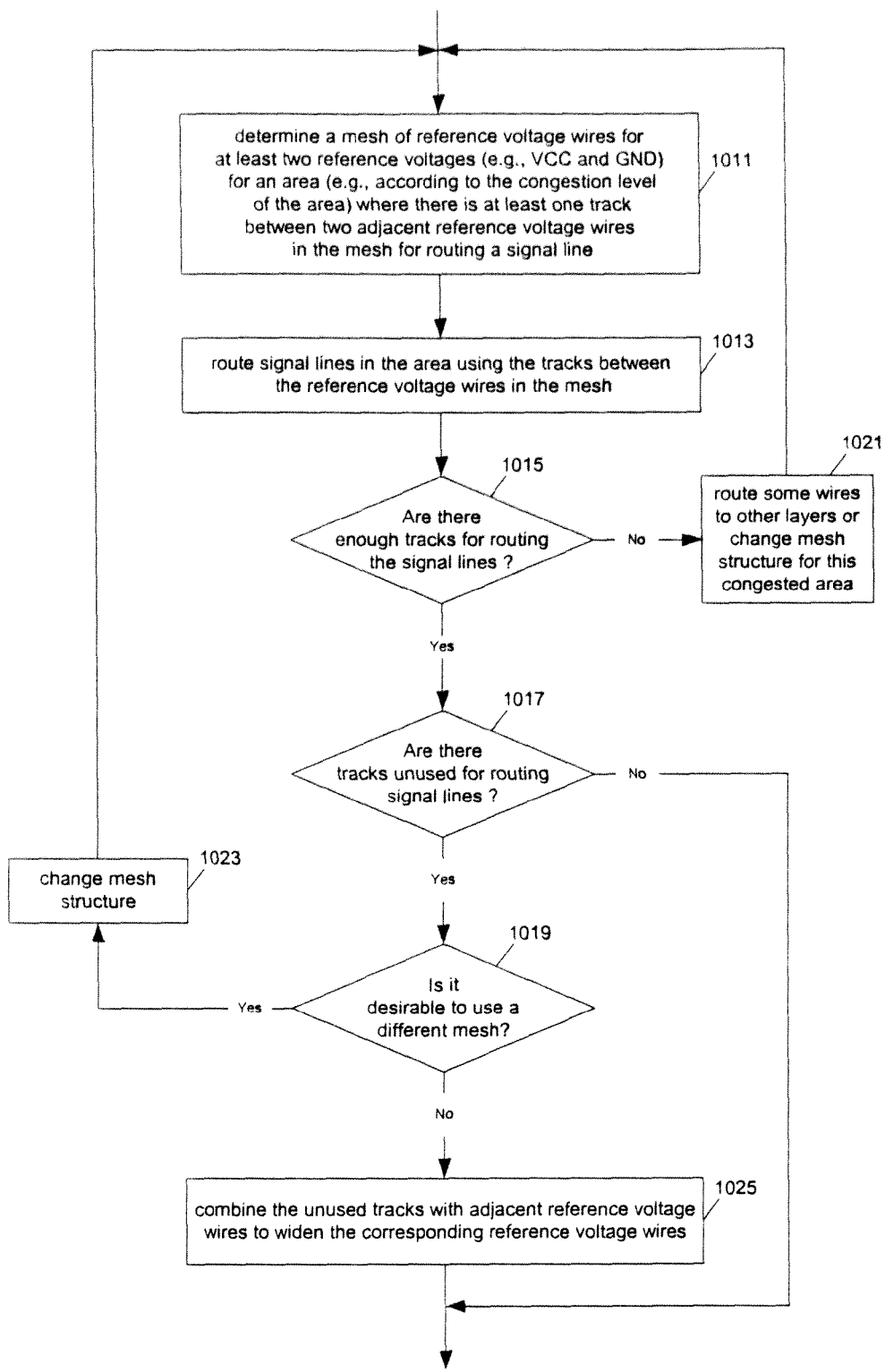
FIG. 23 shows a method to route signal lines for an integrated circuit according to one embodiment of the present invention.

FIG. 23 shows a method to route signal lines for an integrated circuit according to one embodiment of the present invention. Operation 1011 determines a mesh of reference voltage wires for at least two reference voltages (e.g., VCC and GND) for an area (e.g., according to the congestion level of the area) where there is at least one track between two adjacent reference voltage wires in the mesh for routing a signal line. In one embodiment of the present invention, the reference voltage wires are interconnected (e.g., through connection vias) for each of the reference voltages to form a reference voltage mesh so that the segments between the connections are reduced. According to the congestion level, which may be estimated before a routing operation or determined from a previous routing operation, the pattern of the reference voltage wires and tracks (e.g., patterns as shown in FIGS. 6-10) for routing signals is determined (or selected). For example, the shielding mesh may have a window with a ring (e.g., FIGS. 15-18) surrounding the window for a very congested area such as a congested area in a layer above or below the window; or a shielding mesh in one layer may have a pattern as shown in FIG. 10 for a less congested area or a shielding mesh in one layer may have a pattern as shown in FIG. 28A. Operation 1013 routes signal lines in the area using the tracks between the reference voltage wires in the mesh. If operation 1015 determines that there are not enough tracks for routing the signal lines, operation 1021 routes some wires to other layers or changes mesh structure (wire patterns) for this congested area; otherwise, operation 1017 determines whether or not there are tracks unused for routing signal lines. If there are unused tracks (entirely unused tracks, such as track 565 in FIG. 12, or partially unused tracks, such as track 567 in FIG. 12), operation 1019 determines whether or not it is desirable to use a different mesh. If it is desirable to use a different mesh, the mesh structure can be changed in operation 1023 to assign more areas for the shielding wires to improve the effectiveness of shielding and the capacity of the mesh to distribute current with minimum voltage drops; otherwise, operation 1025 combines the unused tracks with adjacent reference voltage wires to widen the corresponding reference voltage wires (generate wider shielding wires with larger current carrying capacities). Some operations in the example of FIG. 23 are optional; and different flow sequences may be used. For example, operations 1019 and 1023 are not performed in one embodiment of the present invention.

Figure 24:
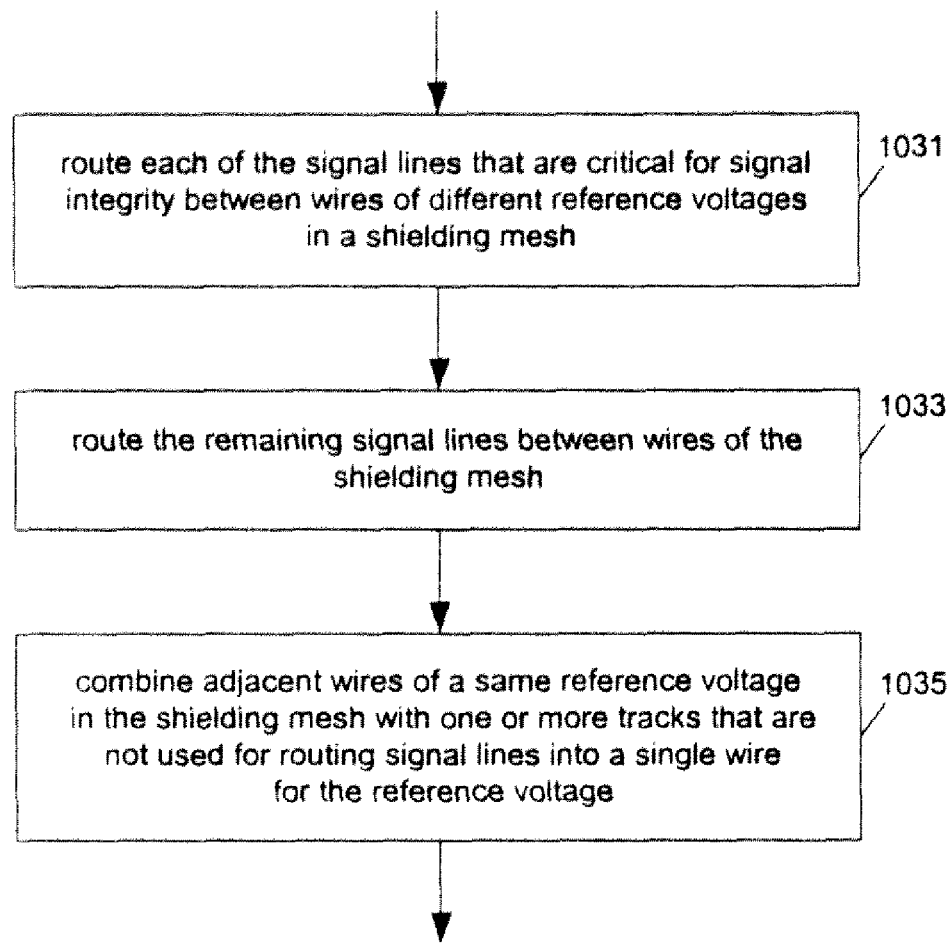
FIG. 24 shows a method to route signal lines in a shielding mesh according to one embodiment of the present invention.

FIG. 24 shows a method to route signal lines in a shielding mesh according to one embodiment of the present invention. After operation 1031 routes each of the signal lines that are critical for signal integrity between wires of different reference voltages in a shielding mesh, operation 1033 routes the remaining signal lines between wires of the shielding mesh. For example, noisy signal lines (e.g., with a strong drive strength) and long signal wires, which can be critical for signal integrity, are better shielded between shielding wires of different voltages (e.g., between GND and VCC); and short signal wires can be routed between shielding wires of a same voltage (e.g., between a GND/GND pair or a VCC/VCC pair). Operation 1035 combines adjacent wires of a same reference voltage in the shielding mesh with one or more tracks that are not used for routing signal lines into a single, larger wire for the reference voltage. Various methods to combines the adjacent wires, as illustrated in FIG. 13 and described above (e.g., splitting a track for widening adjacent shielding lines of different voltages, filling in the area between adjacent shielding lines of a same voltage, or combining a track with one adjacent shielding line, and others), can be used to widen shielding lines.

Figure 25:
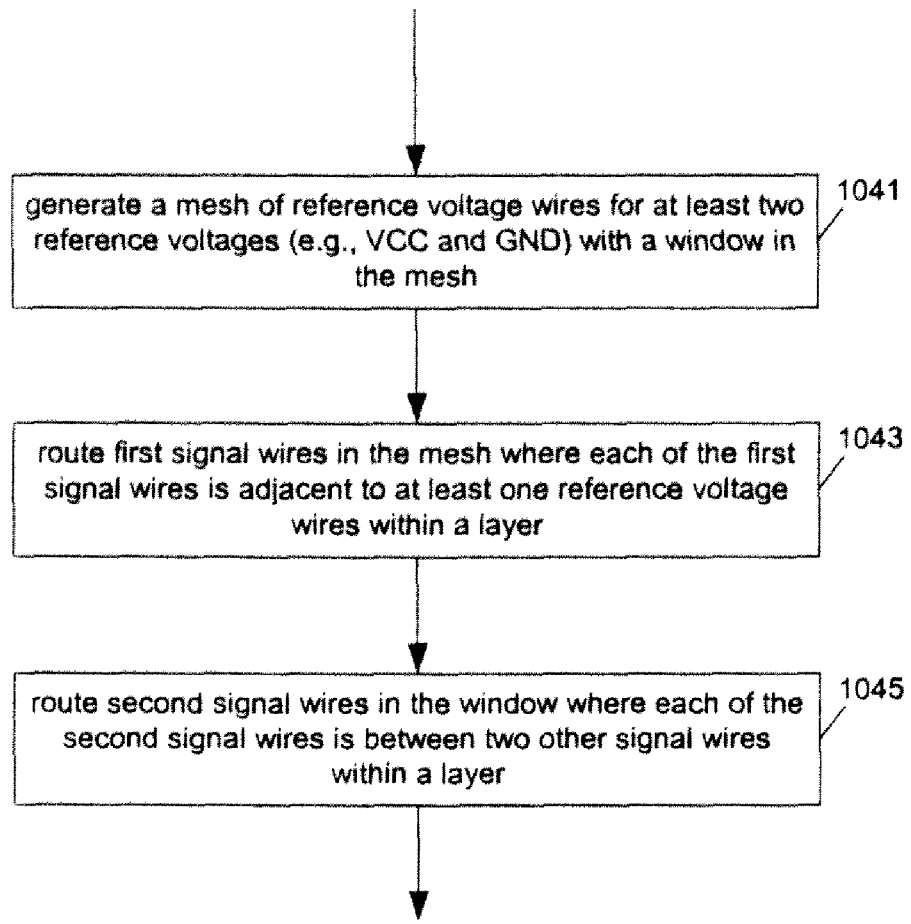
FIG. 25 shows a method to route signal lines in a shielding mesh with a window for unshielded lines according to one embodiment of the present invention.

FIG. 25 shows a method to route signal lines in a shielding mesh with a window for unshielded lines according to one embodiment of the present invention. This method may begin as a result of analysis, by a computer aided design system, of the level of congestion of wires and routes in a representation of the IC being designed. This may occur in an early stage of a routing process by the computer aided design system (e.g. as an estimation of congestion in the design, such as an estimation of space available for routing signal and other lines within the available, desired space of the IC under design or the level of congestion in the design may be determined after an actual routing operation. In this method, at least a portion of at least one layer of the representation of the IC includes a shielding mesh which has been introduced into the representation of the design stored by and manipulated by the computer aided design system. The analysis of the level of congestion takes into account the presence of the shielding mesh, which reduces the area available for routing of lines, such as signal lines, on the IC being designed. The analysis produces a determination of the level of congestion in the representation of the IC. Upon determining that the level of congestion has become unacceptable (e.g. the wiring density is too high to perform a successful routing of the lines on the IC given the desired size, in area, of the IC or the wiring density exceeds a predetermined design rule such as the minimum width of a line), then the computer aided design system introduces a window in the shielding mesh where the window has at least a lower density of shielding than the density of shielding in the shielding mesh which at least in part surrounds or abuts the window. The size of the window may be limited in order to assure that there is only a small length of signal lines which are unshielded in the window. It is possible to tolerate minimal coupling between smaller lengths of unshielded signal lines (rather than longer lengths of unshielded signal lines which will tend to couple signals more due to the longer length of the unshielded signal lines). Thus, the size of the window may be designed to limit its size which in turn will limit the size (e.g. length) of any unshielded signal lines in the window.

Operation 1041, performed by a computer aided design system, generates a mesh of reference voltage wires for at least two reference voltages (e.g., VCC and GND) with a window in the mesh. This may occur as a result of a computer aided design system creating a representation of a window in a representation of the shielding mesh. In one embodiment of the present invention, the window is surrounded by wider shielding wires to reduce the impedance in the shielding mesh caused by the window; in another embodiment of the present invention, a sparser set of shielding wires of different voltages are used in the window. Operation 1043 routes first signal wires in the mesh where each of the first signal wires is adjacent to at least one reference voltage wires within a layer; and operation 1045 routes second signal wires in the window where each of the second signal wires is between two other signal wires within a layer. Some of the second signal wires may be entirely in the window; and some of the second signal wires may be partially the window and partially shielded in the mesh. Signal integrity analysis may be performed for the second signal wires to determine if signal integrity in the IC is preserved.

Figure 26:
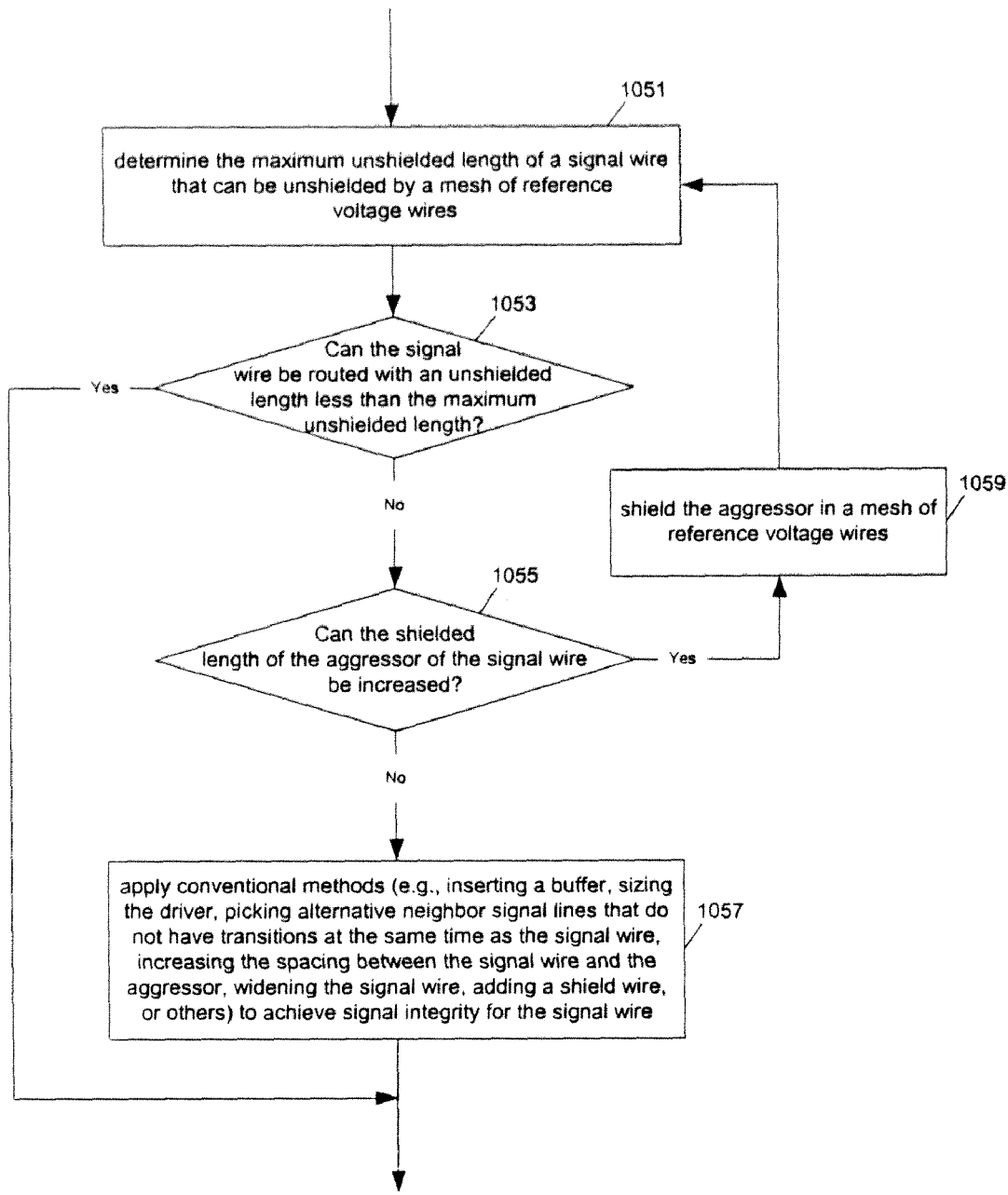
FIG. 26 shows a method to route unshielded or partially shielded signal lines in a window of a shielding mesh according to one embodiment of the present invention.

FIG. 26 shows a method to route unshielded or partially shielded signal lines in a window of a shielding mesh according to one embodiment of the present invention. Operation 1051 determines the maximum (allowable) unshielded length of a signal wire that can be unshielded by a mesh of reference voltage wires. In one embodiment of the present invention, an RLC (Resistance, Inductance and Capacitance) model of the driver, wire, and neighbor wires are used to determine the signal coupling. The neighbors are known as aggressors, and the signal line being routed is known as the victim. The RLC model assumes that a worst case aggressor is along an unshielded portion of the "victim." The RLC model is used to analyze the effect of the worst case edge rate (or current ramp for inductance) in order to determine the maximum unshielded length of the signal wire in assessing signal integrity. Operation 1053 determines whether or not the signal wire can be routed with an unshielded length less than the maximum unshielded length. If the signal cannot be routed with an routed with an unshielded length less than the maximum unshielded length and operation 1055 determines that the shielded length of the aggressor of the signal wire cannot be increased, operation 1057 applies conventional methods (e.g., inserting a buffer/repeater, sizing the driver, picking alternative neighbor signal lines that do not have transitions at the same time as the signal wire, increasing the spacing between the signal wire and the aggressor, widening the signal wire, adding a shield wire, or others) to achieve signal integrity for the signal wire. Otherwise, operation 1059 shields the aggressor in a mesh of reference voltage wires (e.g., reducing the portion of the aggressor that is not shielded in the shielding mesh).

Some embodiments of the present invention allow external signals to be routed through or over a region for an IP block (e.g. a predesigned block, such as block 903) without the fear of signal integrity problems caused by unknown signals being routed near the internal signals of the IP block.

Figure 27:
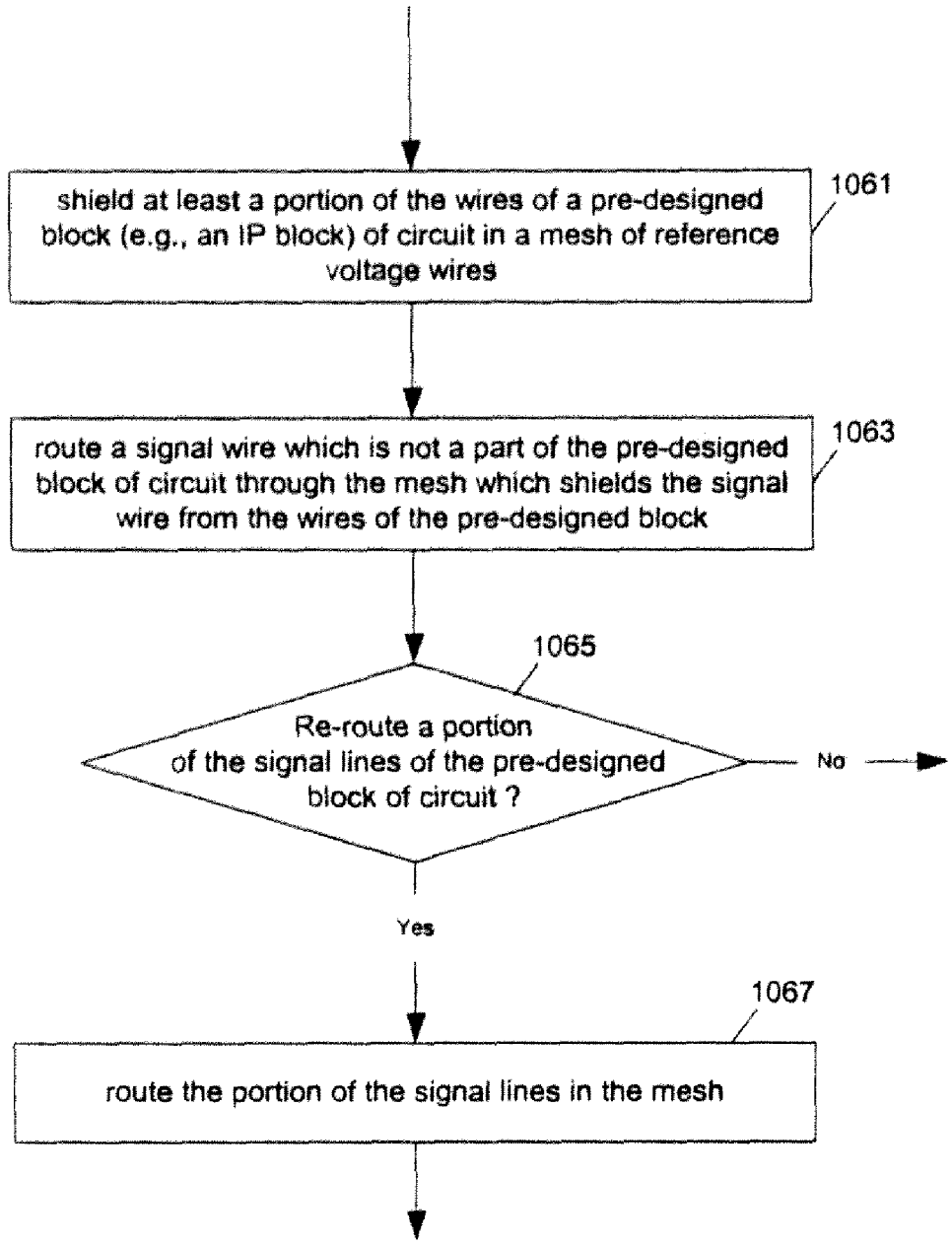
FIG. 27 shows a method to route signal lines through a region of a pre-designed block of circuit in a shielding mesh according to one embodiment of the present invention.

FIG. 27 shows a method to route signal lines through a region of a pre-designed block of circuit (such as an IP block) in a shielding mesh according to one embodiment of the present invention. Operation 1061 shields at least a portion of the wires of a pre-designed block (e.g., an IP block) of circuitry in a mesh of reference voltage wires. Operation 1063 routes a signal wire that is not a part of the pre-designed block of circuit through the mesh, which shields the signal wire from the wires of the pre-designed block. If operation 1065 determines that it is desirable to re-route a portion of the signal lines of the pre-designed block of circuit, operation 1067 routes the portion of the signal lines in the shielding mesh. Thus, after a shielding mesh is added to the routing area for the IP block (in a top view of the IC), signal wires for other block can be routed through or over the region defined by the IP block; and some of the wires of the IP block can be re-routed.

Figure 31:
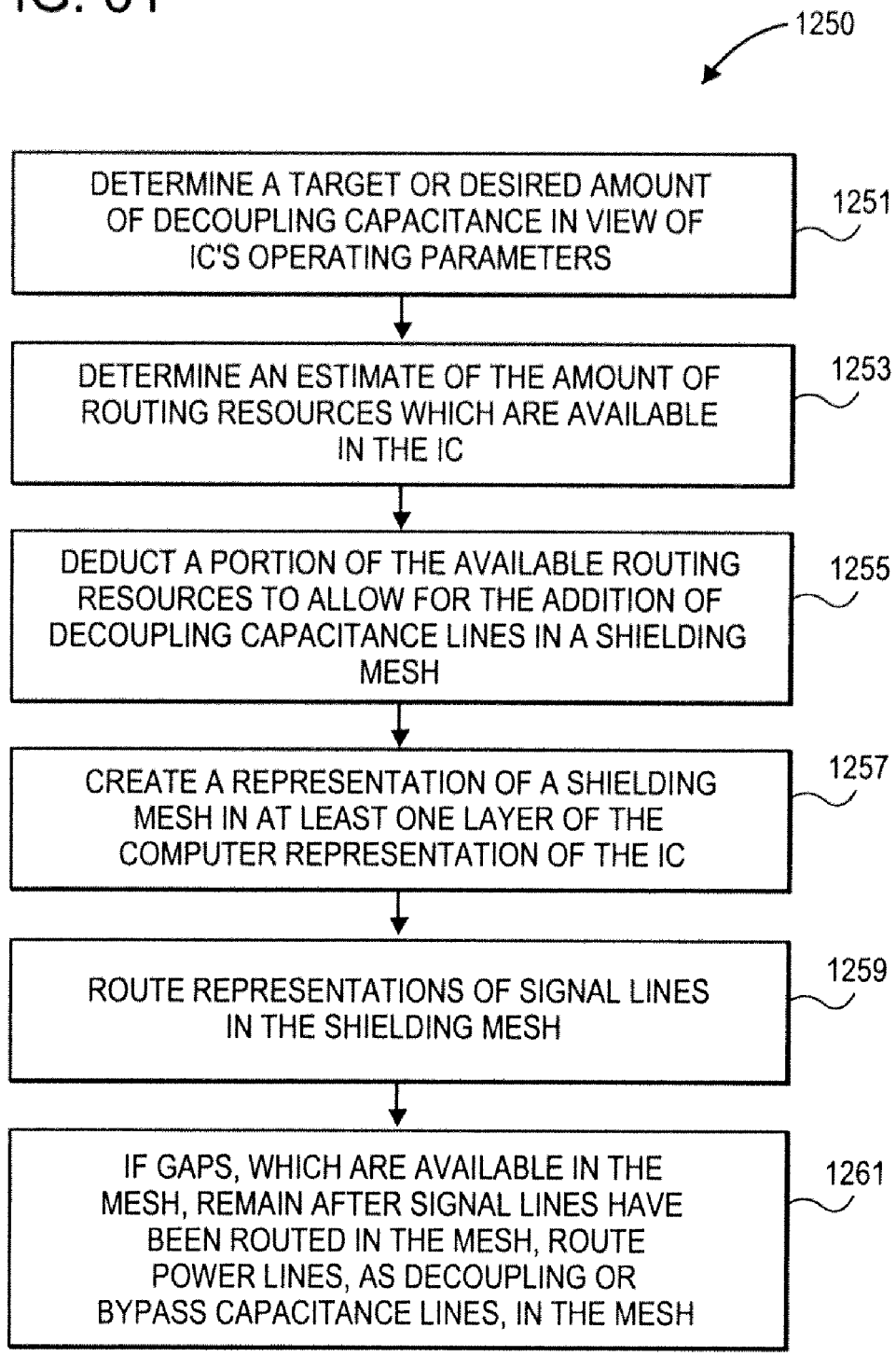
FIG. 31 is a flow chart showing one exemplary method of designing an IC.

FIG. 31 shows a flowchart which depicts a method 1250 of designing an IC which includes a shielding mesh with decoupling capacitance. This method may be used in designing shielding meshes as shown in FIG. 28B or 29B. The method 1250 includes operation 1251 in which a target (or desired) amount of decoupling capacitance is determined. In operation 1253, an estimate is made of the amount of available routing resources. In operation 1255, a portion of the available routing resources is deducted in order to preserve tracks in the shielding mesh for the addition of additional reference voltage lines (which act as decoupling capacitance lines) in the shielding mesh. A representation (e.g. a computer aided design representation) of the shielding mesh is created in operation 1257, and in operation 1259, representations of signal lines are routed in the shielding mesh. If gaps (e.g. the gap between lines 1201C and 1201D) in the shielding mesh are available after the signal lines have been routed, then additional reference voltage lines may be added in operation 1261 to increase the amount of decoupling capacitance, up to the amount of desired decoupling capacitance.

Figure 33:
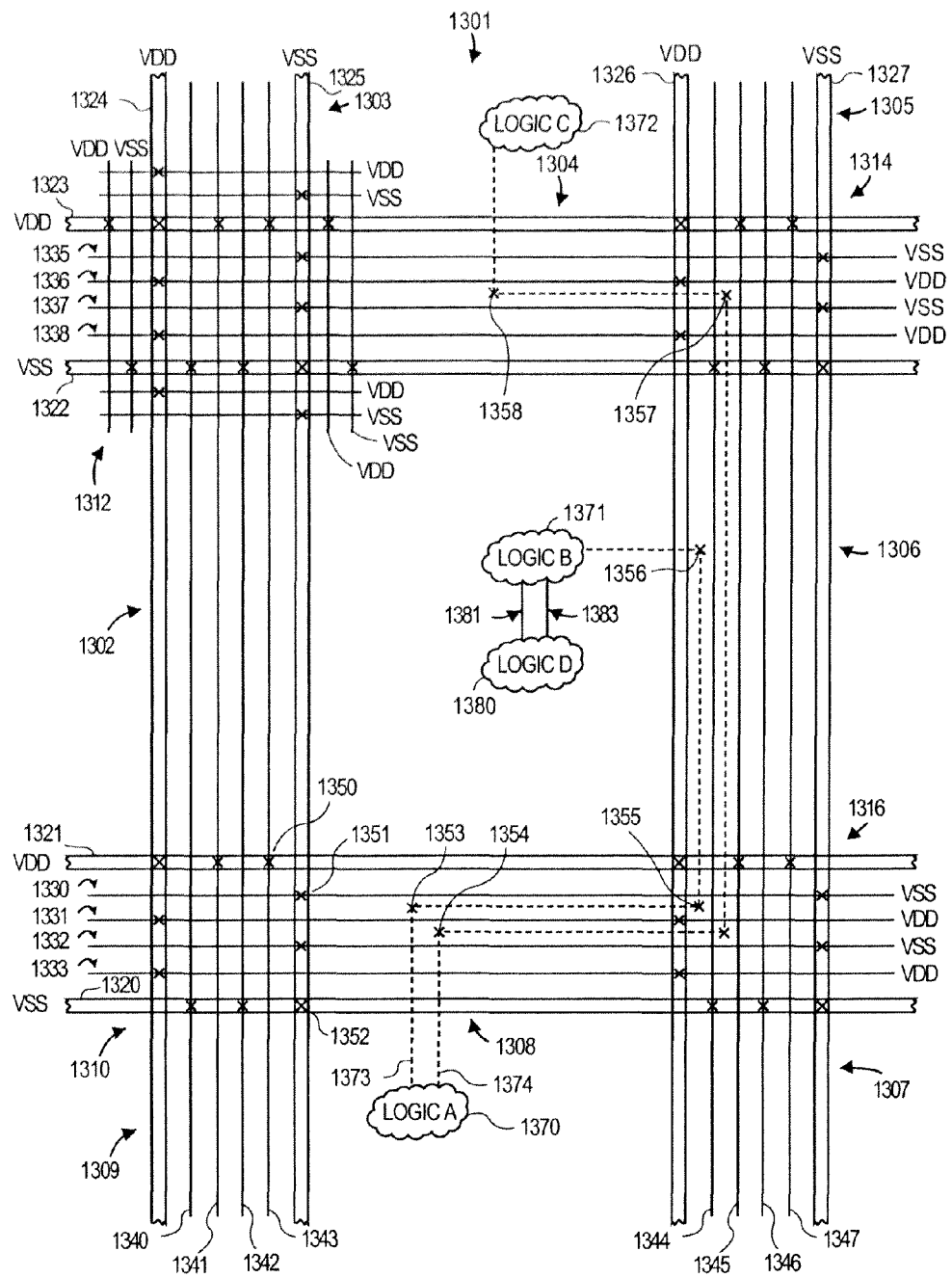
FIG. 33 shows a top view of another embodiment of a shielding mesh having two layers in portions of the shielding mesh and having one layer in other portions.

FIG. 33 shows an example of a shielding mesh which includes several different types of shielding in the mesh. FIG. 33 is a top view of a portion of an IC and shows two routing layers of the IC and also shows certain logic (logic A, B and C) which is on lower layers of the IC. The shielding mesh 1301 includes four double layer shielding meshes 1310, 1312, 1314, and 1316 and at least eight single layer shielding meshes 1302, 1303, 1304, 1305, 1306, 1307, 1308, and 1309. There are also unshielded regions which do not include any shielding wires, and thus any signal lines in these regions are unshielded. The unshielded regions include a region which contains logic A (1370), a region which contains logic B (1371) and which is bounded by single layer shielding meshes 1302, 1304, 1306 and 1308, and a region which contains logic C (1372). There are also unshielded regions to the left of a widened VDD line 1324 and to the right of a widened VSS line 1327 as shown in FIG. 33. Each shielding mesh contains a first plurality of lines (e.g. lines 1321, 1323, 1324, 1326, 1336, 1338, 1331, 1333, 1341, 1343, 1345 and 1347) which are designed to provide a first reference voltage (e.g. VDD) and a second plurality of lines (e.g. lines 1320, 1322, 1325, 1327, 1330, 1332, 1335, 1337, 1340, 1342, 1344, and 1346) which are designed to provide a second reference voltage (e.g. VSS in the case of FIG. 33). The larger reference voltage lines (e.g. lines 1320, 1321, 1322, 1323, 1324, 1325, 1326, and 1327) provide increased current carry capacity for the shielding and provide interconnections (e.g. through connection vias 1350, 1351, and 1352) to other reference voltage lines in the shielding mesh. The connection vias between layers are shown by an "X" in FIG. 33; FIG. 4 shows, in perspective view, examples of connection vias in a double layer shielding mesh (see connection vias 301 and 303 in FIG. 4). Additional connection vias may be added to further improve the quality (e.g. reduced impedance) of the shielding mesh. The connection vias are also used to route signal lines from one layer to another layer above or below the one layer; for example, connection vias 1353, 1354, 1355 and 1356 provide for the routing of signal lines from logic A (1370) to logic B (1371) and logic C (1372) as shown in FIG. 33. It will be appreciated that a single layer shielding mesh in the architecture of FIG. 33 will resemble the shielding mesh of FIG. 29; however, a double repeating pattern shielding mesh (e.g. as shown in FIG. 28) may alternatively be used in either or both of the single layer and double layer shielding meshes of FIG. 33. It will also be appreciated that additional reference voltage lines may be added to the shielding mesh to provide bypass capacitance between the reference voltages (e.g. see FIG. 28B; the adding of these additional reference voltages would normally be performed after successfully routing all signal lines in a manner which satisfies timing constraints of the IC. The double layer shielding mesh 1312 is slightly larger than the other double layer shielding meshes 1310, 1314 and 1316 and provides additional double layer shielding mesh capacity; the other double layer shielding meshes may similarly be increased in size. Similarly, one or more of the single layer shielding meshes may extend beyond the widened VSS and VDD lines.

The routing of signal lines in the shielding mesh 1301 will now be described relative to signal lines coupling logic A, logic B and logic C in FIG. 33. It will be appreciated that additional logic units with additional signal lines may also be routed in the shielding mesh of FIG. 33. Logic A (1370), in an unshielded region below the single layer shielding mesh 1308, provides two signal lines 1373 and 1374 which may both be outputs driven by a driver in logic A (1370). A first unshielded portion of signal line 1373 extends from logic A and is routed to an area below the single layer shielding mesh 1308. A connection via 1353 electrically connects signal line 1373 from one layer (e.g. a first layer) to another layer (e.g. a second layer) which includes the single layer shielding mesh 1308, from which point the signal line 1373 is routed in the single layer shielding mesh 1308 and into the double layer shielding mesh 1316 where the signal line 1373 is electrically connected, through connection via 1355, to a routing of signal line 1373, on the first layer, and this routing of signal line 1373 extends along an available gap or track in the single layer shielding mesh 1306 until it reaches the connection via 1356. At connection via 1356, the signal line 1373 is routed to the second layer and extends away from mesh 1306 in an unshielded region and connects to logic B to drive inputs in logic B. It can be seen from FIG. 33 that only a small portion of signal line 1373 is unshielded and this small portion may be within a maximum allowable unshielded length for signal line 1373. The unshielded regions of FIG. 33 may be considered "windows" (which are similar to the windows described herein, such as the window shown in FIG. 15).

Signal line 1374 has a similar routing path as signal line 1373 except that signal line 1374 passes through three single layer shielding meshes and two double layer shielding meshes on its way from logic A (1370) to logic B (1372). A first unshielded portion of signal line 1374 extends from logic A and is routed to an area below the single layer shielding mesh 1308. A connection via 1354 electrically connects signal line 1374 from the first layer to the second layer which includes the mingle layer shielding mesh 1308, from which point the signal line 1374 is routed in the mesh 1308 and into the double layer shielding mesh 1316. In this mesh 1316 the signal line 1374 is electrically connected through a connection via to a routing of signal line 1374, again on the first layer, through an available gap in the mesh 1306 until it reaches an electrical connection via 1357 within the double layer shielding mesh 1314 which connection via 1357 causes the signal line 1374 to be routed between lines 1336 and 1337, firstly in the double layer shielding mesh 1314 and then in the single layer shielding mesh 1304 until line 1374 reaches the connection via 1358. At connection via 1358, the signal line 1374 is routed to the first layer (from the second layer which includes lines 1336 and 1337) and extends away from mesh 1304 into an unshielded region which includes connections to logic C, where signal line 1374 connects to logic C to drive inputs in logic C (1372). It will be appreciated that the use of shielding meshes may allow higher power drivers (e.g. amplifiers) to be used to drive the signal lines which are shielded (e.g. lines 1373 and/or 1374).

It will also be appreciated that, as shown in FIG. 33, additional logic units (e.g. logic D, labeled 1380) may be connected through unshielded signal lines 1381 and 1383 to logic B in the unshielded region which contains both logic B and logic D. It is possible, in the example shown in FIG. 33, to route signal lines 1381 and 1383 without shielding because these lines are short enough (e.g. the maximum unshielded length calculated from RLC models for signal lines 1381 and 1383 is less than the actual unshielded length of the routed signal lines 1381 and 1383 shown in FIG. 33) that they do not require shielding. It will also be appreciated that a predesigned block (e.g. an IP block with or without its own integral shielding mesh) may be incorporated into an unshielded region.

An alternative of the shielding mesh 1301 may use a structure which is similar to the shielding mesh 1301 but in which one or more portions of the mesh exist on other layers (other than the two layers which comprise, for example, the double layer shielding mesh 1310). For instance, one or more of the long primarily single layer meshes (e.g. mesh 1306 and 1308) and their shielded signal lines (e.g. 1373 and 1374) may be routed for a portion of their runs along the two layers having double layer shielding meshes 1310 and 1316 and then be routed down or up, through connection vias, to other layers and then back to the two layers having the double layer meshes 1310 and 1316. Thus, the single layer mesh runs between the crossover areas (the double layer mesh areas) may change to other layers. In one particular embodiment these single layer mesh runs with their shielded signal lines may be placed on pre-fabricated or pre-configured layers such as those found in gate arrays and structured ASICs where some mesh layers are held fixed across different designs, which saves routing resources on the configurable layers. In this case, the unused routing tracks between reference voltages can be used to increase the current carrying capacity of the power grid and to provide bypass capacitance for the grid. A subset of these routing tracks may also be pre-configured with repeaters to improve performance and signal integrity of signals routed over very long distances.

Figure 34A:
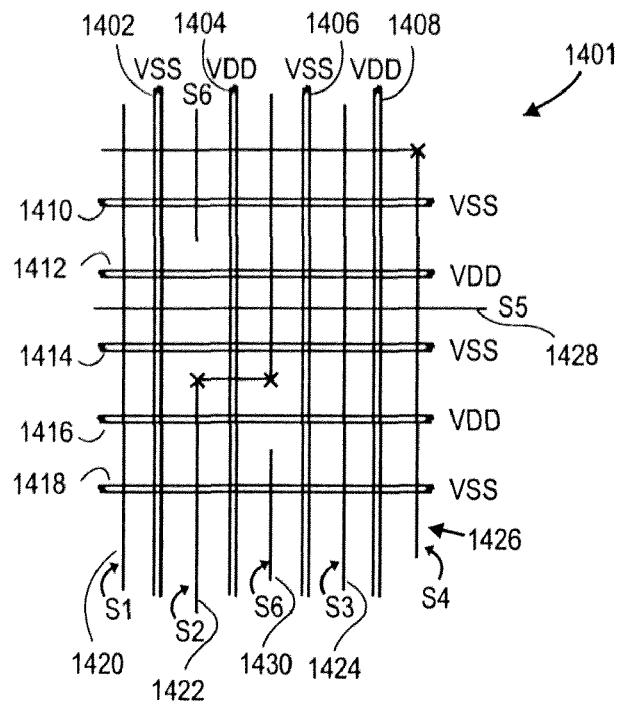
FIGS. 34A and 34B show a top view of a shielding mesh which changes in the process of designing an IC, according to another embodiment.
Figure 34B:
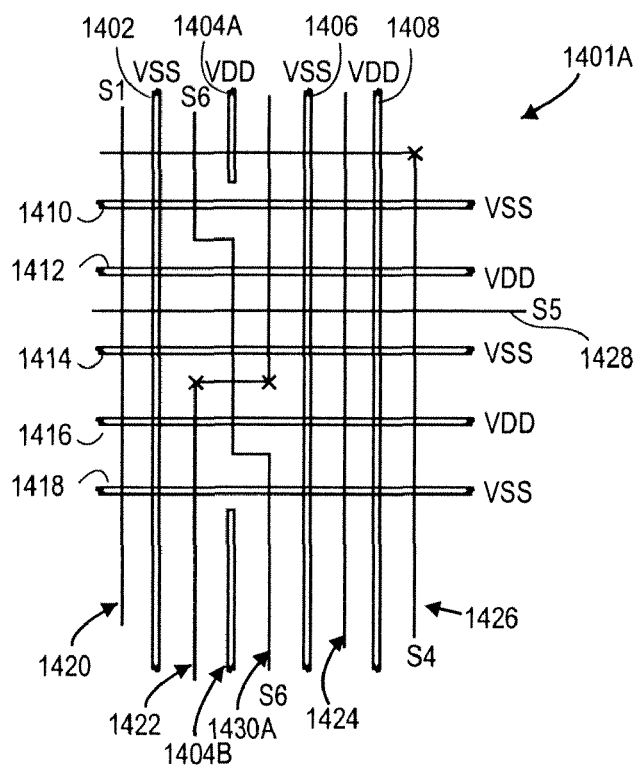
Figure 35:
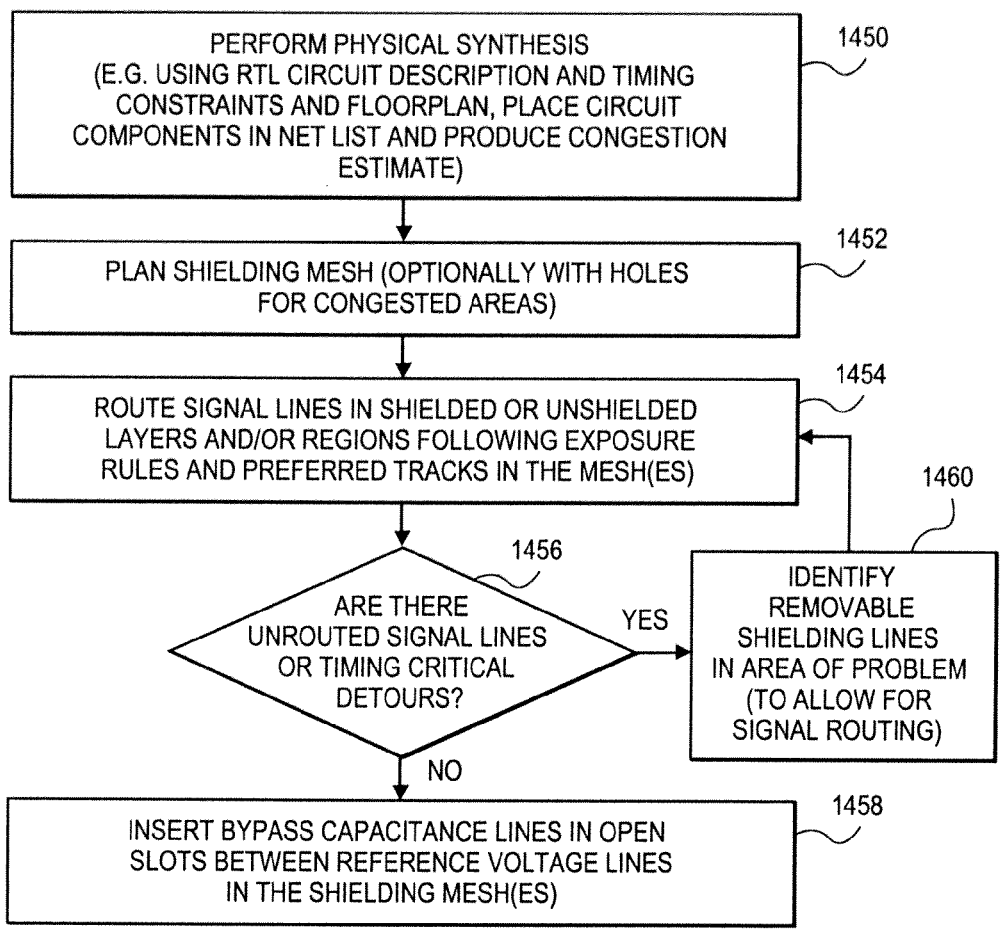
FIG. 35 is a flow chart which shows an exemplary method of designing an IC according to another aspect of the invention.

FIGS. 34A, 34B and 35 show another exemplary method for designing an IC. Operation 1450 of FIG. 35 may begin after a compilation of a technology independent HDL (hardware description language) into an RTL (register transfer level) description which is converted into a technology dependent RTL netlist. Other techniques may be used to create the RTL netlist. In operation 1450, physical synthesis is performed using an RTL circuit description (e.g. an RTL netlist) and timing constraints and a floorplan (if any); this physical synthesis places the logic primitives in the netlist and optionally generates a congestion estimate (e.g. an estimate of the amount of routing relative to the available routing resources). In operation 1452, a shielding mesh is planned. The shielding mesh may include an optional hole or window for routing in congested areas. Then in operation 1454, signal lines are routed in shielded or unshielded layers or regions based upon exposure rules for signal lines and based upon the use of preferred tracks in the mesh. These exposure rules include: (a) routing long signal lines between opposite reference voltage lines in a shielding mesh, if possible; (b) routing noisy signal lines (e.g. those having predictably high edge rates) between opposite reference voltage lines in a shielding mesh; (c) routing clock lines in the shielding mesh; (d) routing signal lines, which have a length which exceed their calculated maximum unshielded line length, in a shielding mesh; (e) routing in a shielding mesh signal lines which transition between signal states (e.g. high to low and vice versa) at near the same time as another adjacent signal line and (f) routing signal lines which are not directly connected to a predesigned block (e.g. IP block) through an integral shielding layer in the block. Other exposure rules and preferred tracks are also described herein. An exemplary result of operation 1454 is shown in FIG. 34A in which a two layer shielding mesh 1401 includes a first plurality of reference voltage lines 1402, 1406, 1410, 1414 and 1418 which provide a first reference voltage (VSS in this example) and a second plurality of reference voltage lines 1404, 1408, 1412, and 1416 which provide a second reference voltage (VDD in this example). These reference voltage lines together form the two layer shielding mesh 1401. The operation 1454 has successfully routed signal lines S1 (1420), S2 (1422), S3 (1424), S4 (1426) and S5 (1428) through the shielding mesh 1401. Connection vias between layers are shown with an "X." Signal line S6 (1430) has not been successfully routed by the first performance of operation 1454, and this is shown in FIG. 34A as a lack of connection between the upper and lower portions of signal line S6. This failure to route a signal line is detected in operation 1456 of FIG. 35 and causes the system to perform operation 1460. Operation 1456 also detects whether a routing of a signal line has caused a timing critical signal to be too late (e.g. a detour of a critical path signal line has caused the signal line to have a negative slack); if this is detected, operation 1460 is also performed. An exemplary result of operation 1460 and a repeat of operation 1454 is shown in FIG. 34B as operation 1460 has identified that a portion of shielding line 1404 is removable and that shielding line has been removed and replaced with shielding lines 1404A and 1404B which leave a gap to allow for routing of signal line S6 (1430A) which is shown, in FIG. 34B, as routed through the track previously reserved for line 1404. After operation 1456 determines that routing was successful, then in operation 1458, bypass capacitance lines may be added in the open slots between reference voltage lines. For example, in the case of the shielding mesh 1401A, an additional reference voltage line (e.g. VSS) may be added between reference voltage lines 1410 and 1412 and/or between lines 1416 and 1418. The amount of additional reference voltage lines which are added will depend upon the desired or target amount of decoupling or bypass capacitance for the shielding mesh.

Although some examples of the present invention are illustrated with shielding meshes that are aligned with a substrate grid, the wires of a shielding mesh may not aligned with any grid. Further, the wires of a shielding mesh within a layer do not have to run in a same direction. A router can introduce the shielding mesh into the substrate while routing the signal wires; and, a shielding mesh may evolve during a routine operation as the router introduces new shielding wires, combines shielding wires and tracks in between, removes some shielding wires for routing signals, etc.

In one embodiment of the present invention, a fully connected power and ground shielding mesh can be used to remove capacitive and inductive coupling. The main sources for this mesh are the main power grid trunks, independent power and ground trunks, and/or other reference voltages stabilized for shielding, where they are relatively noiseless. A shielding mesh can also be connected to more than two reference voltages.

The shielding mesh can also be used in standard cells or gate array routing areas, routing channels or routing channels on top of hard macros, data bus routing, control bus routing, address bus routing, analog signal routing, clocks and clock bus routing, or any other signal lines. It will be appreciated that, normally, the reference voltages (and the lines carrying the reference voltages) are not intended to fluctuate over time; that is, these lines are intended to have relatively stable voltages over time. Signal lines, on the other hand, are intended (and expected) to fluctuate over time as a result of the operation of the circuit.

With two or more interwoven meshes, each of which is fully connected and energized at two or more reference voltages, the automated chip routing can be much more worry-free; and the signal integrity problems due to capacitive and inductive coupling can be virtually eradicated.

While most embodiments of the present invention are intended for use in systems containing signal routing software (e.g. place and route systems or physical synthesis systems), the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention have been described in the context of use in HDL synthesis systems and physical synthesis systems, and particularly those designed for use with integrated circuits which have vendor-specific technology/architectures. As is well known, the target architecture is typically determined by a supplier of programmable ICs. Examples of target architecture are the structured ASIC targets such as NEC's ISSP (Instant Silicon Solution Platforms) devices and LSI Logic's Rapid Chip devices. For certain preferred embodiments, the present invention may be employed with application-specific integrated circuits (ASICs).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory machine readable storage medium containing executable computer program instructions which when executed by a digital processing system cause said system to perform a method to design an Integrated Circuit (IC) device, the method comprising:
   determining a representation of a shielding mesh in a substrate, the shielding mesh including a first plurality of connected wires for a first reference voltage and a second plurality of connected wires for a second reference voltage; and
   routing a representation of a first plurality of signal wires in the substrate to shield at least a first portion of each of the first plurality of the signal wires between one of the first plurality of connected wires and one of the second plurality of connected wires from adjacent signal wires;
   wherein a second portion of the first plurality of signal wires are adjacent to each other in a region defined by the first and second pluralities of connected wires, wherein at least one of the first plurality of connected wires in the region is replaced with one of the first plurality of signal wires.

2. The medium as in claim 1 wherein an average length of segments of the first and second pluralities of connected wires between nodes each of which joins more than two wires in the shielding mesh is substantially less than an average length of the first plurality of signal wires.

3. The medium as in claim 1 wherein the first plurality of connected wires and the second plurality of connected wires are in two layers in the substrate; a first plurality of vias connect the first plurality of wires; a second plurality of vias connect the second plurality of wires; and the first and second pluralities of vias divide the first and second pluralities of connected wires into segments that are substantially shorter than an average length of the first plurality of signal wires.

4. The medium as in claim 3 wherein wires in the two layers are in directions that are in an acute angle with a direction of wires in a third layer of the IC device.

5. The medium as in claim 4 wherein the acute angle comprises 45 degrees.

6. The medium as in claim 3 wherein wires in the first layer are in a first direction; wires in the second layer are in a second direction; and, the first direction and the second direction are in an acute angle.

7. The medium as in claim 6 wherein the acute angle comprises 45 degrees.

8. The medium as in claim 1 wherein the first reference voltage is power; and the second reference voltage is ground.

9. The medium as in claim 1 wherein the method further comprises:
   routing a second plurality of signal wires in the substrate to shield each of the second plurality of signal wires between two of the first plurality of connected wires from adjacent signal wires.

10. The medium as in claim 9 wherein the second plurality of signal wires are less subjected to signal integrity problems than the first plurality of signal wires if routed without shielding.

11. The medium as in claim 1 wherein a first wire of the first plurality of connected wires is wider than more than one of the first and second pluralities of connected wires.

12. The medium as in claim 11 wherein the first wire is wider than a combined width of one of the first and second pluralities of connected wires and one of the first plurality of signal wires.

13. The medium as in claim 1 wherein the method further comprises:
routing a third plurality of signal wires in the substrate, the third plurality of signal wires being within a window defined by a subset of the first and second pluralities of connected wires in a top view of the IC, each of the third plurality of signal wires being adjacent to at least one of the third plurality of signal wires without shielding in between.

14. The medium as in claim 13 wherein each of the subset is substantially wider than the third plurality of signal wires.

15. The medium as in claim 1 wherein the method further comprises:
routing a third plurality of signal wires in a first layer in the substrate, the third plurality of signal wires being within first two wires of the first and second pluralities of connected wires, the first two wires being substantially wider than the third plurality of signal wires, the third plurality of signal wires being substantially parallel to each other, each of the third plurality of signal wires being adjacent to at least one of the third plurality of signal wires without shielding in between.

16. The medium as in claim 15 wherein the first two wires define a first window within which signal lines are not shielded in the first layer.

17. The medium as in claim 15 wherein the method further comprises:
routing a fourth plurality of signal wires in a second layer in the substrate, the fourth plurality of signal wires being within second two wires of the second and second pluralities of connected wires, the second two wires being substantially wider than the fourth plurality of signal wires, the fourth plurality of signal wires being substantially parallel to each other, each of the fourth plurality of signal wires being adjacent to at least one of the fourth plurality of signal wires without shielding in between.

18. The medium as in claim 17 wherein the first two wires define a first window within which signal lines are not shielded in the first layer; the second two wires define a second window within which signal lines are not shielded in the second layer; the first and second windows substantially coincide with each other in a top view of the IC.

19. The medium as in claim 15 wherein the method further comprises:
determining an allowable unshielded length of a signal line that can be unshielded by the shielding mesh;
routing the signal line with a portion of the signal line unshielded by the shielding mesh shorter than the allowable unshielded length.

20. The medium as in claim 1 wherein the method further comprises:
routing the first and second pluralities of connected wires within a region defined by an IP block in a top view of the IC.

21. The medium as in claim 1 wherein first at least one of the first plurality of signal wires is a part of an IP block; and wherein second at least one of the first plurality of signal wires is not a part of the IP block.

22. The medium as in claim 21 wherein the second at least one of the first plurality of signal wires is within a region defined by the IP block in a top view of the IC.

23. The medium as in claim 22 wherein the method further comprises:
re-routing one of the first at least one of the first plurality of signal wires.

24. The medium as in claim 1 wherein the method further comprises:
widening one of the first plurality of connected wires.

25. The medium as in claim 24 wherein said widening comprises:
combining at least two of adjacent ones of the first plurality of connected wires into one wider wire.

26. The medium as in claim 24 wherein said widening comprises:
filling in an area between two of the first plurality of connected wires to generate one wider wire.

27. The medium as in claim 1 wherein the method further comprises:
routing a first wire for the first reference voltage on a first layer of the IC device;
wherein the first plurality of connected wires comprises a second wire;
the second plurality of connected wires comprises a third wire;
the second and third wires are on the first layer of the IC device;
the first wire is between the second and third wires; and
the second and third wires are adjacent neighbors to the first wire.

28. The medium as in claim 27 wherein spacing between the first and second wires and between the first and third wires is substantially equal to average wire spacing in the first layer.

29. The medium as in claim 28 wherein widths of the first, second and third wires are substantially equal.

30. The medium as in claim 1 wherein the method further comprises:
routing a first wire for the first reference voltage on a first layer of the IC device;
wherein the first plurality of connected wires comprises a second wire and a third wire;
the second and third wires are on the first layer of the IC device;
the first wire is between the second and third wires; and
the second and third wires are adjacent neighbors to the first wire.

31. The medium as in claim 30 wherein spacing between the first and second wires and between the first and third wires is substantially equal to average wire spacing in the first layer.

32. The medium as in claim 31 wherein widths of the first, second and third wires are substantially equal.

33. The method of designing an integrated circuit (IC), said method comprising:
creating a representation of a shielding mesh in a representation of a design of said IC, said shielding mesh comprising a first single layer shielding mesh and a first double layer shielding mesh which is coupled to said first single layer shielding mesh;
creating a representation of a first signal line having a first unshielded portion, which is disposed in a first region of said IC which is adjacent to said first single layer shielding mesh, and having a first shielded portion which is disposed in said first single layer shielding mesh, and having a second shielded portion which is disposed in said first double layer shielding mesh, wherein a reference voltage line in the first region of the shielding mesh is replaced with the first unshielded portion of the first signal line, wherein at least one of the creating the representation of the shielding mesh and creating the representation of the first signal line is performed by a processor.

34. The method as in claim 33 wherein said first signal line also comprises a third shielded portion which is disposed in a second single layer shielding mesh and a second unshielded portion which is disposed in a second region of said IC which is adjacent to said second single layer shielding mesh.

35. The method as in claim 34 wherein said creating said representation of said first signal line comprises routing said first unshielded portion to said first single layer shielding mesh, routing said first shielded portion in said first single layer shielding mesh, routing said second shielded portion in said first double layer shielding mesh, routing said third shielded portion in said second single layer shielding mesh, and routing said second unshielded portion to said second region.

36. The method as in claim 35 wherein said shielding mesh comprises a second double layer shielding mesh which is coupled to said second single layer shielding mesh and wherein said first signal line comprises a fourth shielded portion which is disposed in said second double layer shielded mesh.

37. The method as in claim 34 wherein each of said first single layer shielding mesh, said first double layer shielding mesh, and said second single layer shielding mesh comprises a first plurality of reference voltage lines designed to provide a first reference voltage and a second plurality of reference voltage lines designed to provide a second reference voltage.

38. The method as in claim 37, said method further comprising:
creating a representation of at least one reference voltage line, designed to provide said first reference voltage, disposed between a pair of adjacent second plurality of reference voltage lines in said shielding mesh.

39. The method as in claim 38, wherein said at least one reference voltage line provides a bypass capacitance between said first and said second reference voltages and is created after signal lines have been routed in said shielding mesh.

40. A non-transitory machine readable storage medium containing executable computer program instructions which when executed by a digital processing system cause said system to perform a method of designing an integrated circuit (IC), said method comprising:
creating a representation of a shielding mesh in a representation of a design of said IC, said shielding mesh comprising a first single layer shielding mesh and a first double layer shielding mesh which is coupled to said first single layer shielding mesh;
creating a representation of a first signal line having a first unshielded portion, which is disposed in a first region of said IC which is adjacent to said first single layer shielding mesh, and having a first shielded portion which is disposed in said first single layer shielding mesh, and having a second shielded portion which is disposed in said first double layer shielding mesh, wherein a reference voltage line in the first region of the shielding mesh is replaced with the first unshielded portion of the first signal line.

41. The machine readable medium as in claim 40 wherein said first signal line also comprises a third shielded portion which is disposed in a second single layer shielding mesh and a second unshielded portion which is disposed in a second region of said IC which is adjacent to said second single layer shielding mesh.

42. The machine readable medium as in claim 41 wherein said creating said representation of said first signal line comprises routing said first unshielded portion to said first single layer shielding mesh, routing said first shielded portion in said first single layer shielding mesh, routing said second shielded portion in said first double layer shielding mesh, routing said third shielded portion in said second single layer shielding mesh, and routing said second unshielded portion to said second region.

43. The machine readable medium as in claim 42 wherein said shielding mesh comprises a second double layer shielding mesh which is coupled to said second single layer shielding mesh and wherein said first signal line comprises a fourth shielded portion which is disposed in said second double layer shielded mesh.

44. The machine readable medium as in claim 41 wherein each of said first single layer shielding mesh, said first double layer shielding mesh, and said second single layer shielding mesh comprises a first plurality of reference voltage lines designed to provide a first reference voltage and a second plurality of reference voltage lines designed to provide a second reference voltage.

45. The machine readable medium as in claim 44, said method further comprising:
creating a representation of at least one reference voltage line, designed to provide said first reference voltage, disposed between a pair of adjacent second plurality of reference voltage lines in said shielding mesh.

46. The machine readable medium as in claim 45, wherein said at least one reference voltage line provides a bypass capacitance between said first and said second reference voltages and is created after signal lines have been routed in said shielding mesh.

47. A non-transitory machine readable storage medium containing executable computer program instructions which when executed by a digital processing system cause said system to perform a method of designing an integrated circuit (IC), said method comprising:
creating a representation of a shielding mesh in at least one layer of a representation of a design of said IC;
routing representations of signal lines in said shielding mesh and outside of said shielding mesh based upon a set of predetermined rules;
determining whether a re-routing condition exists;
identifying removable shielding lines in said shielding mesh in response to determining that said re-routing condition exists.

48. The machine readable medium as in claim 47, wherein said method further comprises:
routing representations of signal lines in place of removable shielding lines, and wherein said shielding mesh comprises at least two layers of said IC, and wherein said re-routing condition exists if there are insufficient routing resources or if a routing exceeds a timing requirement.

49. The machine readable medium as in claim 47, wherein said method further comprises:
routing additional reference voltage lines in said shielding mesh to provide for bypass capacitors.

50. The machine readable medium as in claim 47 wherein said shielding mesh comprises at least one window having a lower shielding density than said shielding mesh.

51. The machine readable medium as in claim 47, wherein said method further comprises:
determining a maximum unshielded line length for at least some of said signal lines;
routing at least a first signal line in an unshielded manner if said first signal line has a length which is less than said maximum unshielded line length for said first signal line.

52. The machine readable medium as in claim 47, wherein said predetermined rules comprise at least one of: (a) routing long signal lines between opposite reference voltage lines in said shielding mesh; (b) routing noisy signal lines between opposite reference voltage lines in said shielding mesh; (c) routing clock lines in said shielding mesh; (d) routing signal lines, which have a length which exceed their calculated maximum unshielded line length, in said shielding mesh; (e) routing signal lines which transition between states at near the same time as a clock signal transitions between states in said shielding mesh; or (f) routing signal lines, which are not directly connected to circuitry in a predesigned block of logic, over said predesigned block of logic through an integral shielding mesh of said predesigned block of logic.

53. A non-transitory machine readable storage medium containing executable computer program instructions which when executed by a digital processing system cause said system to perform a method of designing an integrated circuit (IC), said method comprising:
    creating a representation of a shielding mesh in at least one layer of a representation of a design of said IC;
    routing representations of signal lines in said shielding mesh based upon a set of predetermined rules; and
    removing a portion of a shielding line in said shielding mesh in connecting a representation of a signal line.

54. The machine readable medium as in claim 53, wherein said representation of said signal line is routed using at least a portion of a resource corresponding to said portion of said shielding line.

55. The machine readable medium as in claim 54, wherein a portion of said representation of said signal line is routed using at least a portion of said resource corresponding to said portion of said shielding line.

56. The machine readable medium as in claim 54, wherein a representation of a connection via for routing said signal line uses at least a portion of said resource corresponding to said portion of said shielding line.

57. The machine readable medium as in claim 56, wherein said shielding mesh comprises at least two layers of said IC.

58. The machine readable medium as in claim 54, wherein said method further comprises:
    determining whether a re-routing condition exists;
    wherein said removing said portion of said shielding line is in response to determining that said re-routing condition exists.

59. The machine readable medium as in claim 58, wherein said re-routing condition exists if there are insufficient routing resources or if a routing exceeds a timing requirement.

60. The machine readable medium as in claim 53, wherein said method further comprises:
    identifying said portion of said shielding line as removable to route said representation of said signal line.

61. The machine readable medium as in claim 53 wherein said shielding mesh comprises at least one window having a lower shielding density than said shielding mesh.

62. The machine readable medium as in claim 53, wherein said predetermined rules comprise at least one of:
    (a) routing long signal lines between opposite reference voltage lines in said shielding mesh;
    (b) routing noisy signal lines between opposite reference voltage lines in said shielding mesh;
    (c) routing clock lines in said shielding mesh;
    (d) routing signal lines, which have a length which exceed their calculated maximum unshielded line length, in said shielding mesh;
    (e) routing signal lines which transition between states at near the same time as a clock signal transitions between states in said shielding mesh; or (f) routing signal lines, which are not directly connected to circuitry in a predesigned block of logic, over said predesigned block of logic through an integral shielding mesh of said predesigned block of logic.

63. A method of designing an integrated circuit (IC), said method comprising:
    creating a representation of a shielding mesh in at least one layer of a representation of a design of said IC;
    routing representations of signal lines in said shielding mesh based upon a set of predetermined rules; and
    removing a portion of a shielding line in said shielding mesh in connecting a representation of a signal line, wherein at least one of the creating, routing, and removing is performed by a processor.

64. The method as in claim 63, wherein said representation of said signal line is routed using at least a portion of a resource corresponding to said portion of said shielding line.

65. The method as in claim 64, wherein a portion of said representation of said signal line is routed using at least a portion of said resource corresponding to said portion of said shielding line.

66. The method as in claim 64, wherein a representation of a connection via for routing said signal line uses at least a portion of said resource corresponding to said portion of said shielding line.

67. The method as in claim 66, wherein said shielding mesh comprises at least two layers of said IC.

68. The method as in claim 64, further comprising:
    determining whether a re-routing condition exists;
    wherein said removing said portion of said shielding line is in response to determining that said re-routing condition exists.

69. The method as in claim 68, wherein said re-routing condition exists if there are insufficient routing resources or if a routing exceeds a timing requirement.

70. The method as in claim 63, further comprising:
    identifying said portion of said shielding line as removable to route said representation of said signal line.

71. The method as in claim 63 wherein said shielding mesh comprises at least one window having a lower shielding density than said shielding mesh.

72. The method as in claim 63, wherein said predetermined rules comprise at least one of:
    (a) routing long signal lines between opposite reference voltage lines in said shielding mesh;
    (b) routing noisy signal lines between opposite reference voltage lines in said shielding mesh;
    (c) routing clock lines in said shielding mesh;
    (d) routing signal lines, which have a length which exceed their calculated maximum unshielded line length, in said shielding mesh;
    (e) routing signal lines which transition between states at near the same time as a clock signal transitions between states in said shielding mesh; or
    (f) routing signal lines, which are not directly connected to circuitry in a predesigned block of logic, over said predesigned block of logic through an integral shielding mesh of said predesigned block of logic.

* * * * *